US012660273B2

(12) United States Patent
Nagahama et al.

(10) Patent No.: US 12,660,273 B2
(45) Date of Patent: Jun. 16, 2026

(54) METHOD OF MANUFACTURING SEMICONDUCTOR DEVICE

(71) Applicant: RENESAS ELECTRONICS CORPORATION, Tokyo (JP)

(72) Inventors: Yu Nagahama, Tokyo (JP); Yuya Abiko, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 373 days.

(21) Appl. No.: 18/449,769

(22) Filed: Aug. 15, 2023

(65) Prior Publication Data

US 2024/0136410 A1     Apr. 25, 2024
US 2024/0234517 A9     Jul. 11, 2024

(30) Foreign Application Priority Data

Oct. 20, 2022     (JP) ................................. 2022-168496

(51) Int. Cl.
| | |
|---|---|
| *H10D 64/01* | (2025.01) |
| *H10D 30/01* | (2025.01) |
| *H10D 30/66* | (2025.01) |
| *H10D 64/00* | (2025.01) |
| *H10D 64/27* | (2025.01) |

(52) U.S. Cl.
CPC ......... *H10D 64/01* (2025.01); *H10D 30/0297* (2025.01); *H10D 30/668* (2025.01); *H10D 64/0135* (2026.01); *H10D 64/112* (2025.01); *H10D 64/117* (2025.01); *H10D 64/516* (2025.01)

(58) Field of Classification Search
CPC ............ H10D 30/0289; H10D 30/668; H10D 30/0297; H10D 64/117; H10D 64/513; H10D 64/68; H10D 64/681; H10D 1/665; H10D 64/01; H10D 64/516; H01L 21/32105
See application file for complete search history.

(56) References Cited

U.S. PATENT DOCUMENTS

| | | | | |
|---|---|---|---|---|
| 6,710,401 | B2 * | 3/2004 | Nakamura ........... | H10D 30/025 |
| | | | | 257/E21.384 |
| 7,659,575 | B2 | 2/2010 | Matsuura et al. | |
| 2016/0268419 | A1 * | 9/2016 | Kawaguchi .......... | H10D 62/153 |
| 2022/0093750 | A1 * | 3/2022 | Shimabayashi .... | H10D 30/0297 |

FOREIGN PATENT DOCUMENTS

JP          2009-32951 A          2/2009

* cited by examiner

*Primary Examiner* — Jose R Diaz
(74) *Attorney, Agent, or Firm* — Rimon P.C.

(57) ABSTRACT

A trench is formed in a semiconductor substrate. A first silicon oxide film is formed in an inside of the trench. A poly-crystalline silicon film is formed on the first silicon oxide film. A second silicon oxide film is formed from the poly-crystalline silicon film by performing a thermal oxidation treatment to the poly-crystalline silicon film. Thus, an insulating film including the first silicon oxide film and the second silicon oxide film is formed. A first conductive film is formed so as to embed the inside of the trench via the insulating film.

17 Claims, 29 Drawing Sheets

A-A CROSS-SECTION

B-B CROSS-SECTION

A-A CROSS-SECTION

B-B CROSS-SECTION

FIG. 8

B-B CROSS-SECTION

A-A CROSS-SECTION

<FIRST EMBODIMENT>

*FIG. 12*

A-A CROSS-SECTION

B-B CROSS-SECTION

FIG. 13

A-A CROSS-SECTION

B-B CROSS-SECTION

*FIG. 14*

B-B CROSS-SECTION

A-A CROSS-SECTION

*FIG. 16*

A-A CROSS-SECTION

B-B CROSS-SECTION

*FIG. 17*

A-A CROSS-SECTION

B-B CROSS-SECTION

*FIG. 18*

B-B CROSS-SECTION

A-A CROSS-SECTION

FIG. 20

A-A CROSS-SECTION

B-B CROSS-SECTION

*FIG. 21*

A-A CROSS-SECTION

B-B CROSS-SECTION

*FIG. 22*

A-A CROSS-SECTION

B-B CROSS-SECTION

A-A CROSS-SECTION

A-A CROSS-SECTION

<EXAMINED EXAMPLE>

<EXAMINED EXAMPLE>

<EXAMINED EXAMPLE>

<EXAMINED EXAMPLE>

METHOD OF MANUFACTURING SEMICONDUCTOR DEVICE

CROSS-REFERENCE TO RELATED APPLICATIONS

The disclosure of Japanese Patent Application No. 2022-168496 filed on Oct. 20, 2022, including the specification, drawings and abstract is incorporated herein by reference in its entirety.

BACKGROUND

The present disclosure relates to a method of manufacturing a semiconductor device, and more particularly, to a method of manufacturing a semiconductor device having an insulating film formed in an inside of a trench.

Here, there are disclosed techniques listed below. [Patent Document 1] Japanese Unexamined Patent Application Publication No. 2009-032951

In a semiconductor device including a semiconductor element such as a power MOSFET (Metal Oxide Semiconductor Field Effect Transistor), a trench gate structure in which a gate electrode is embedded in a trench is applied. There is a split gate structure, as one type of trench gate structures, in which, in an inside of the trench, a field plate electrode is formed at a lower portion of the trench and a gate electrode is formed at an upper portion of the trench. A potential that is the same potential as a potential to be supplied to a source electrode is to be supplied to the field plate electrode. It is possible to increase the concentration of a drift region by expanding a depletion layer in the drift region by the field plate electrode, and thus, it is possible to reduce the resistance of the drift region.

For example, Patent Document 1 discloses a MOSFET of the split gate structure. In addition, Patent Document 1 discloses a method of manufacturing a semiconductor device comprising steps of: forming an insulating film for the field plate electrode in the inside of the trench by a thermal oxidation treatment; and embedding a conductive film for the field plate electrode in the inside of the trench.

SUMMARY

According to studies by the inventors of the present application, it has been found that when a conductive film serving as a base of the field plate electrode is deposited, a gap (void) called "seam" is likely to be occurred in the conductive film, and thus, various issues may occur due to the gap. FIG. 26 to FIG. 29 show a semiconductor device according to an examined example studied by the present inventors, and show manufacturing processes before and after forming the field plate electrode. Issues occurred in the examined example will be described with reference to FIGS. 26 to 29. It should be noted that the examined example and these issues are not known in the prior art, but are newly found by the inventors of the present application.

As shown in FIG. 26, in the split gate structure, first a trench TR is formed in the semiconductor substrate SUB. Next, an insulating film IF3 for insulating the semiconductor substrate SUB and the field plate electrode with each other is formed in an inside of the trench TR. The thickness of the insulating film IF3 is, for example, 500 nm.

Here, the insulating film IF3 is comprised of a laminated film of a silicon oxide film OX4 formed by a thermal oxidation treatment and a silicon oxide film OX5 formed by a CVD (Chemical Vapor Deposition) method.

Although the insulating film IF3 can be formed by only the thermal oxidation treatment, the semiconductor substrate SUB in a wafer condition tends to warp due to a stress from the insulating film IF3, thereby the warpage may hinder subsequent manufacturing processes. Therefore, it is also conceivable to form the insulating film IF3 by only the CVD method. However, in view of improving the interface state between the insulating film IF3 and the semiconductor substrate SUB, it is preferable to form the silicon oxide film which is in contact with the semiconductor substrate SUB by the thermal oxidation treatment.

Therefore, in the examined example, first a relatively thin silicon oxide film OX4 is formed by the thermal oxidation treatment. Next, a relatively thick silicon oxide film OX5 is formed by the CVD method. The thickness of the silicon oxide film OX4 is, for example, 100 nm. The thickness of the silicon oxide film OX5 on a side surface of the trench TR is, for example, 400 nm. Considering the coverage of the CVD method, in order to make the thickness of the silicon oxide film OX5 on the side surface of the trench TR about 400 nm, for example, the silicon oxide film OX5 having a thickness of about 750 nm needs to be deposited on the entire surface of the semiconductor substrate SUB. Thus, the thickness T3 of the insulating film IF3 on an upper surface of the semiconductor substrate SUB is formed in thick, such as about 850 nm.

Here, when the thick silicon oxide film OX5 formed by the CVD method is applied to the insulating film IF3, a thickness of the insulating film IF3 at the vicinity of the uppermost portion of the trench TR tends to be increased, and thus, the insulating film IF3 is easily formed in an overhang shape. FIG. 26 shows such a portion as an overhang portion 10.

Next, as shown in FIG. 27, a conductive film CF1 for the field plate electrode is deposited in the inside of the trench TR by the CVD method. The conductive film CF1 is, for example, a poly-crystalline silicon film of an n-type. Here, when the insulating film IF3 has an overhang shape, a burying defect of the conductive film CF1 is likely to occur. That is, the gap 20 is likely to be generated in the conductive film CF1.

FIG. 28 shows a state in which the field plate electrode FP is formed by processing the conductive film CF1 with the gap 20. First, the conductive film CF1 formed outside the trench TR is removed. Next, the field plate electrode FP is formed by retreating the conductive film CF1 by an anisotropic etching treatment. Here, since the anisotropic etching treatment is performed to the conductive film CF1 with the gap 20, the upper portion of the field plate electrode FP tends to have an abnormal configuration.

Next, as shown in FIG. 29, the insulating film IF3 formed outside the trench TR is removed by a wet etching treatment, and the insulating film IF3 formed inside the trench TR is retreated. Next, by the thermal oxidation treatment, a gate insulating film GI is formed in the inside of the trench TR on the insulating film IF3, and an insulating film IF2 is formed on a surface of the field plate electrode FP, which is exposed from the insulating film IF3.

Here, the insulating film IF2 is formed along the gap 20. As a result, the field plate electrode FP expands at an inner portion of the field plate electrode FP, and a stress is applied to the outside of the trench TR from the insulating film IF2. In particular, the stress tends to act in the vicinity of the bottom portion of the trench TR. Therefore, a crystalline defect is easily occurred in the semiconductor substrate SUB located nearby the bottom portion of the trench TR. When a large number of crystalline defects is generated, these defects are to be a leak path, which causes the decrease of the breakdown voltage of the MOSFET.

Also, after the manufacturing step shown in FIG. 29, a gate electrode is formed on the field plate electrode FP via the insulating film IF2. When the gap 20 is formed, the upper portion of the field plate electrode FP is easily processed like a protrusion portion. Since the electric field is easily concentrated at such a protrusion portion, the dielectric strength between the field plate electrode FP and the gate electrode is easily deteriorated.

The main purpose of the present application is to solve the issues in the examined example and to improve the reliability of the semiconductor device, by suppressing the generation of the gap 20. Other objects and novel features will become apparent from the description of this specification and the accompanying drawings.

The typical ones of the embodiments disclosed in the present application will be briefly described as follows.

A method of manufacturing a semiconductor device according to one embodiment, comprising steps of: (a) providing a semiconductor substrate of a first conductivity type, the semiconductor substrate having an upper surface and a lower surface; (b) forming a trench in the semiconductor substrate at the upper surface of the semiconductor substrate; (c) forming a first silicon oxide film in an inside of the trench; (d) forming a poly-crystalline silicon film on the first silicon oxide film; (e) by performing a thermal oxidation treatment to the poly-crystalline silicon film and thereby forming a second silicon oxide film from the poly-crystalline silicon film, forming a first insulating film including the first silicon oxide film and the second silicon oxide film; and (f) forming a first conductive film so as to embed the inside of the trench via the first insulating film.

According to an embodiment, the reliability of semiconductor device can be improved.

BRIEF DESCRIPTION OF THE DRAWINGS

FIG. 1 is a plan view showing a semiconductor device according to a first embodiment.

FIG. 6 is a cross-sectional view showing a manufacturing process of the semiconductor device according to the first embodiment.

FIG. 8 is a cross-sectional view showing a manufacturing process of the semiconductor device following FIG. 7.

FIG. 12 is a cross-sectional view showing a manufacturing process of the semiconductor device following FIG. 9.

FIG. 13 is a cross-sectional view showing a manufacturing process of the semiconductor device following FIG. 12.

FIG. 14 is a cross-sectional view showing a manufacturing process of the semiconductor device following FIG. 13.

FIG. 16 is a cross-sectional view showing a manufacturing process of the semiconductor device following FIG. 15.

FIG. 17 is a cross-sectional view showing a manufacturing process of the semiconductor device following FIG. 16.

FIG. 18 is a cross-sectional view showing a manufacturing process of the semiconductor device following FIG. 17.

FIG. 20 is a cross-sectional view showing a manufacturing process of a semiconductor device according to a first modified example.

FIG. 21 is a cross-sectional view showing a manufacturing process of the semiconductor device following FIG. 20.

FIG. 22 is a cross-sectional view showing a manufacturing process of the semiconductor device following FIG. 21.

DETAILED DESCRIPTION

Figure 2:
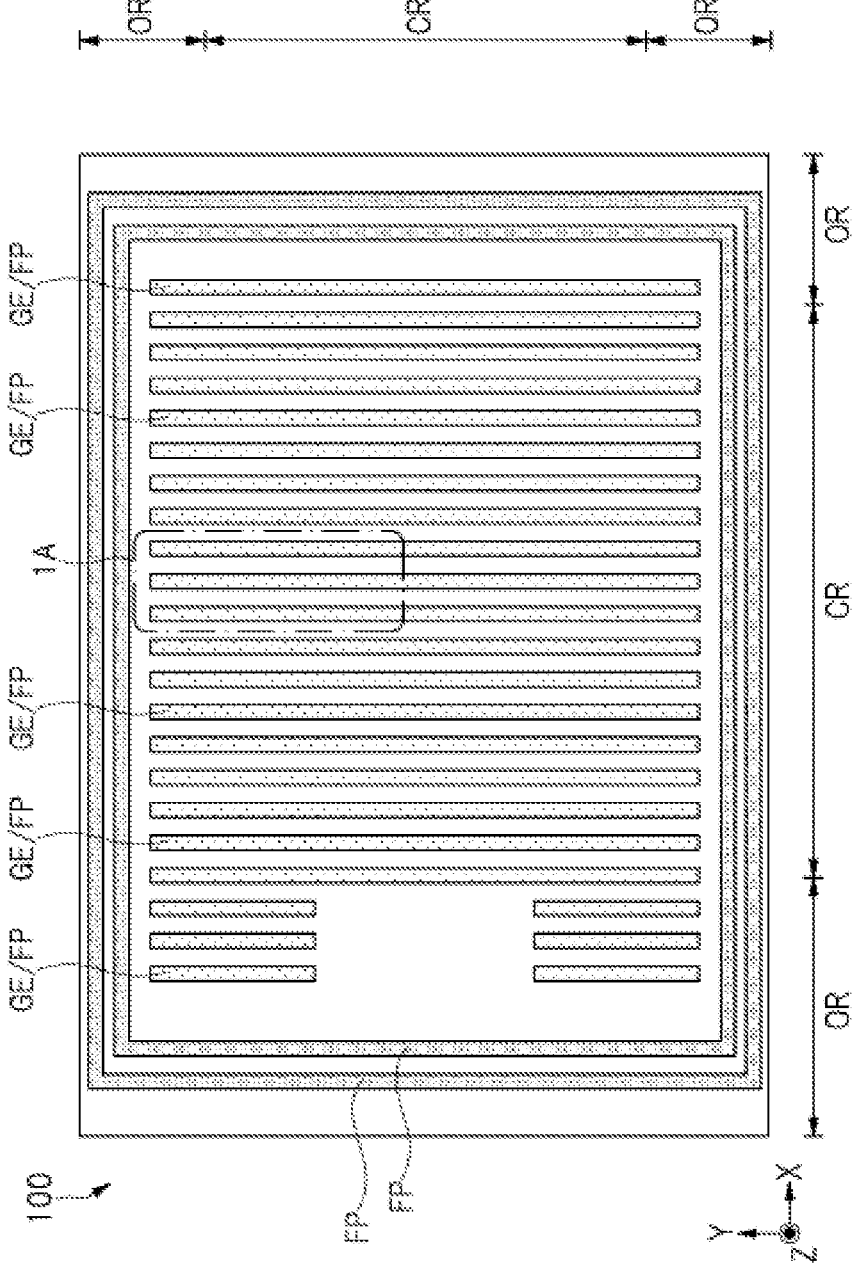
FIG. 2 is a plan view showing the semiconductor device according to the first embodiment.

Embodiments will be described in detail below on the basis of drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction be referred to as Vertical direction, height direction or of a certain structure. In addition, the expression "plan view" or "plan view" used in the present application means that the plane formed by the X direction and the Y direction is a "plane" and the "plane" is viewed from the Z direction.

First Embodiment

<Structure of Semiconductor Device>

Figure 1:
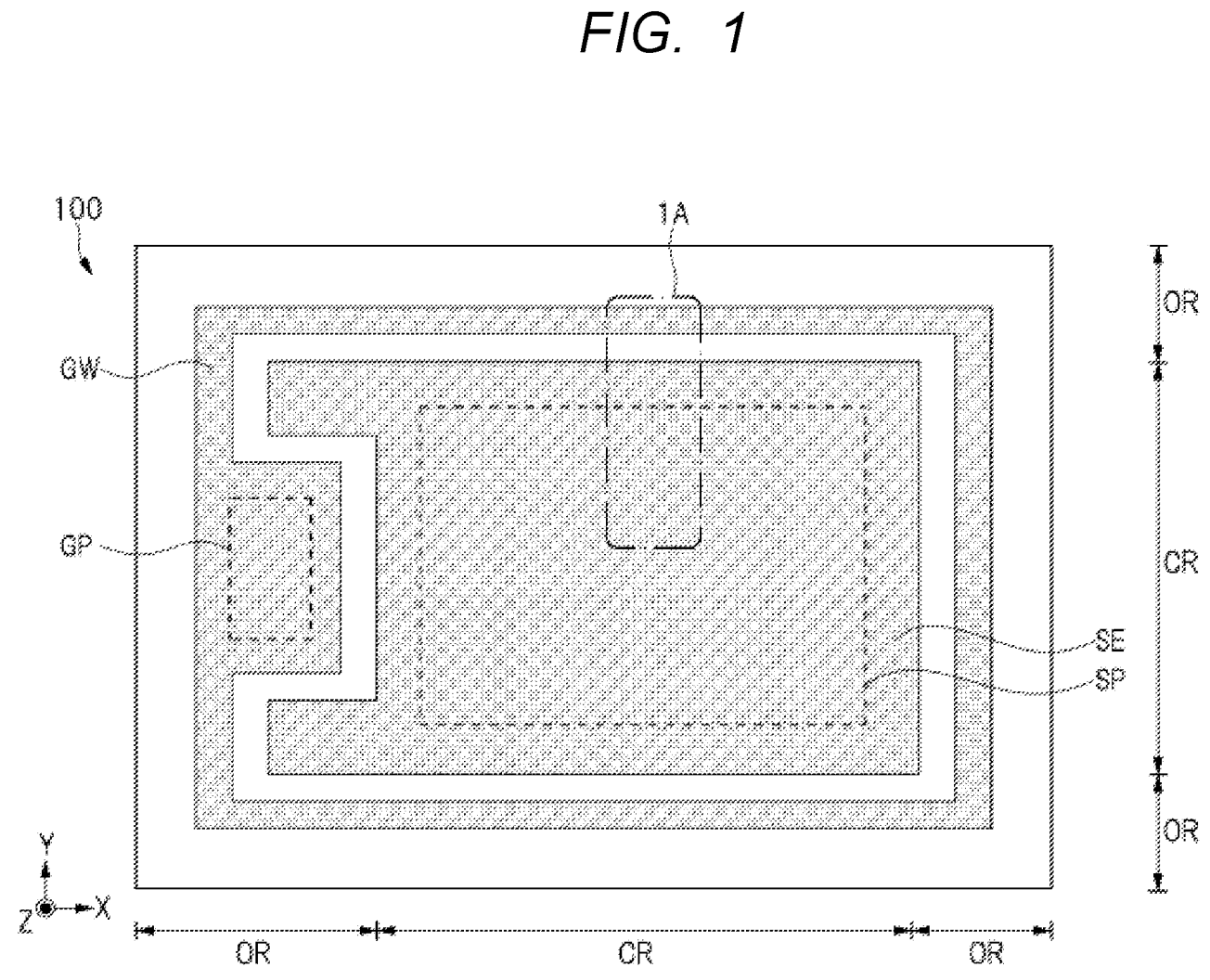

A semiconductor device 100 in a first embodiment will be described below with reference to FIGS. 1 to 5. The main feature of the present application is a manufacturing process of an insulating film IF1 and also manufacturing processes before and after the manufacturing process of the insulating film IF1, and such feature will be described in detail in "METHOD OF MANUFACTURING SEMICONDUCTOR DEVICE" described later.

Figure 3:
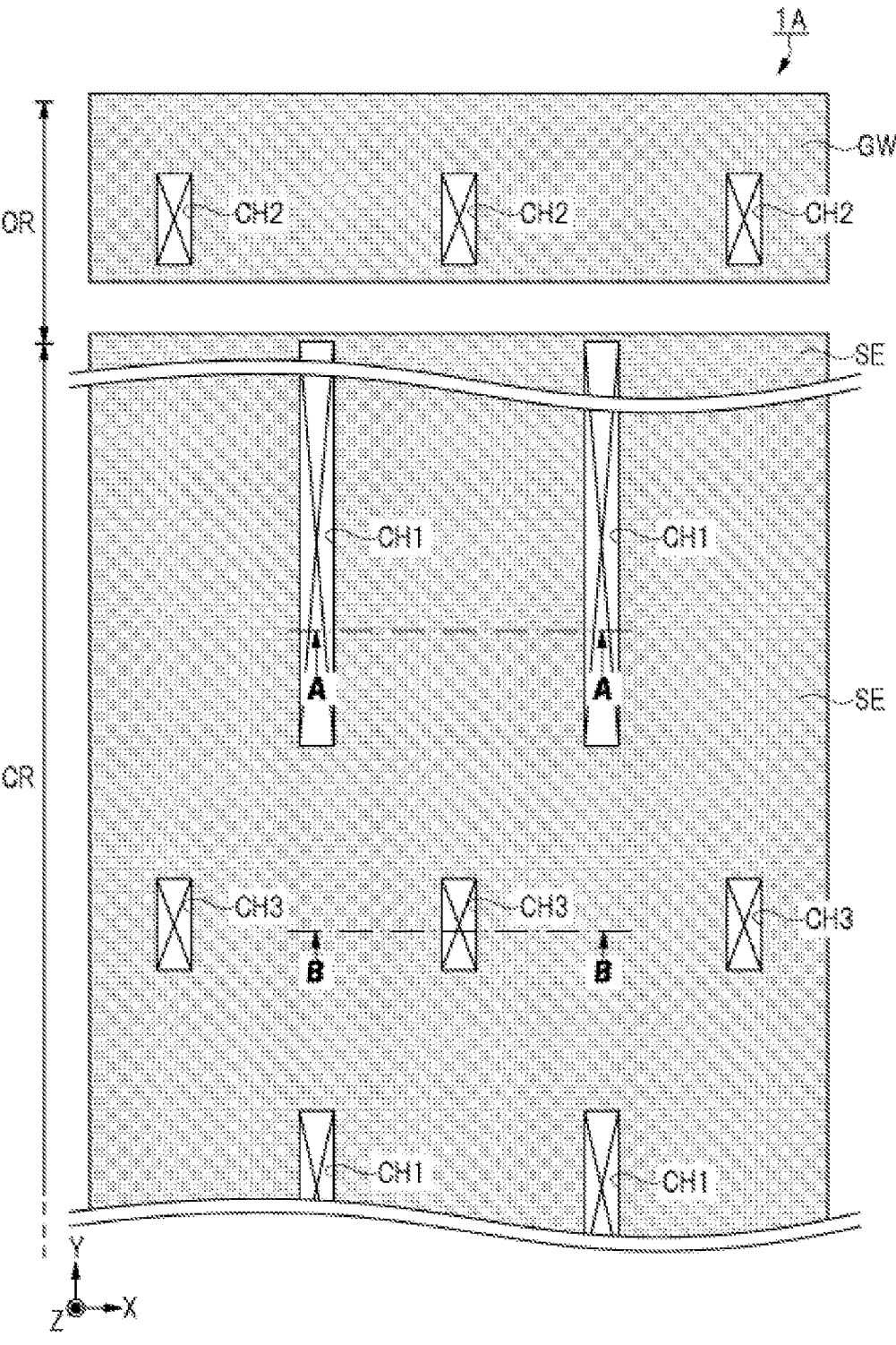
FIG. 3 is an enlarged plan view showing a main portion of the semiconductor device according to the first embodiment.
Figure 4:
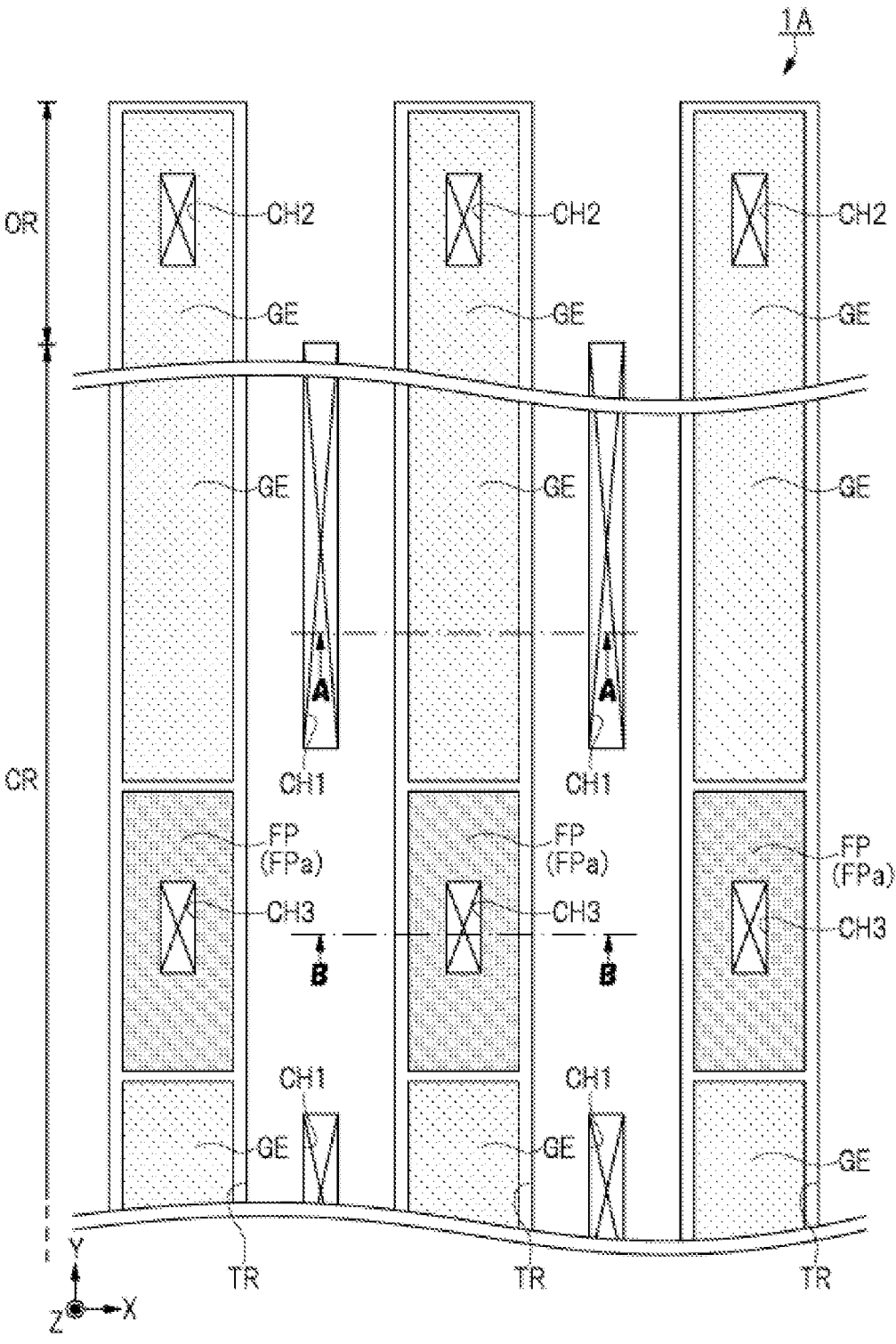
FIG. 4 is an enlarged plan view showing the main portion of the semiconductor device according to the first embodiment.
Figure 5:
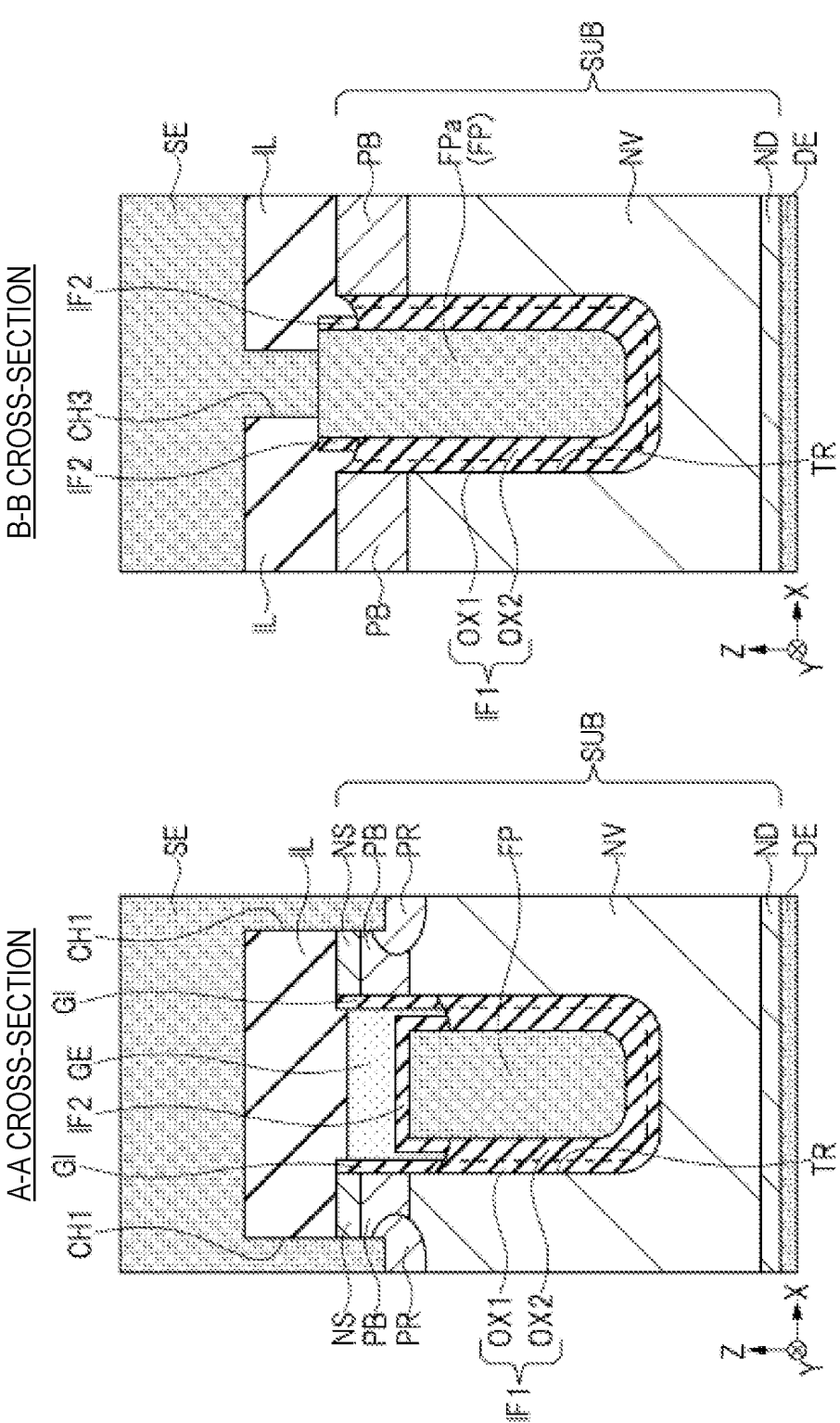
FIG. 5 is a cross-sectional view showing the semiconductor device according to the first embodiment.

FIG. 1 and FIG. 2 are a plan view of a semiconductor chip which is the semiconductor device 100. FIG. 3 and FIG. 4 are an enlarged plan view showing a main portion of the region 1A shown in FIGS. 1 and 2. FIG. 2 and FIG. 4 show the lower structure of FIGS. 1 and 3, mainly showing the structure of the trench gate formed in a semiconductor substrate SUB. The position of the hole CH1~CH3 shown in FIG. 3 corresponds with the position of the hole CH1~CH4 shown in FIG. 4. FIG. 5 is a cross-sectional view along A-A line and B-B line shown in FIGS. 3 and 4.

FIG. 1 shows a wiring pattern formed mainly above the semiconductor substrate SUB. The semiconductor device 100 has a cell region CR and an outer peripheral region OR surrounding the cell region CR in a plan view. The main semiconductor elements such as a plurality of MOSFETs are formed in the cell area CR. The outer peripheral region OR is, for example, used for connecting the gate wiring GW to the gate electrode GE, and for forming a trench TR that functions as a termination region.

As shown in FIGS. 1 and 3, the cell area CR is covered with a source electrode SE. In plan view, the gate wiring GW surrounds the source electrode SE. Although not illustrated here, the source electrode SE and the gate wiring GW are covered with a protective film such as a polyimide film. An opening is provided in a part of the protective film, and the source electrode SE and the gate wiring GW exposed in the opening become the source pad SP and the gate pad GP. An external connecting member is connected to the source pad SP and the gate pad GP, so that the semiconductor device 100 is electrically connected to another semiconductor chip, a wire substrate, or the like. The external connection member is, for example, a wire made of gold or copper, or a clip made of a copper plate.

As shown in FIGS. 2 and 4, a plurality of trench TR are formed in the semiconductor substrate SUB. The plurality of trenches TR formed in the cell regions CR are formed in a stripe-like shape, extend in the Y direction, and adjoin each other in the X direction.

In the cell area CR, in the trench TR, a field plate electrode FP is formed below the trench TR, and a gate electrode GE is formed above the trench TR. A part of the field plate electrode FP forms a contact portion FPa. The field plate electrodes FP constituting the contact portions FPa are formed not only in the lower portion of the trench TR but also in the upper portion of the trench TR in the trench TR. As illustrated in FIG. 4, the contact portion FPa is formed in a part of the cell area CR.

As shown in FIG. 2, the plurality of trenches TR formed in the outer peripheral region OR extend in the Y direction and the X direction so as to surround the cell region CR in a plan view. In the outer peripheral region OR, the inside of the trench TR is buried by the field-plate-electrode FP.

A cross-sectional configuration of the semiconductor device 100 will be described below with reference to FIG. 5.

As shown in FIG. 5, the semiconductor device 100 includes the semiconductor substrate SUB of n-type, which has an upper surface and a lower surface. The semiconductor substrate SUB is made of silicon. The semiconductor substrate SUB has a low concentration n-type drift region NV. Here, the semiconductor substrate SUB of n-type constitutes the drift region NV. Note that the drift region NV may be a semiconductor layer of n-type grown on an n-type silicon substrate while introducing phosphorus (P) by an epitaxial growth method. In the present application, a stack of such an n-typed silicon substrate and an n-typed semiconductor layer is also described as being the semiconductor substrate SUB.

A trench TR that reaches a predetermined depth from the upper surface of the semiconductor substrate SUB is formed in the semiconductor substrate SUB at the upper surface of the semiconductor substrate SUB. The depth of the trench TR is, for example, 5 μm to 7 μm. In the inside of the trench TR, a field plate electrode FP is formed at a lower portion of the trench TR via the insulating film IF1, and a gate electrode GE is formed at an upper portion of the trench TR via a gate insulating film GI. An upper surface of the gate electrode GE is slightly retreated from the upper surface of the semiconductor substrate SUB.

The position of upper surface of the insulating film IF1 is lower than the position of the upper surface of the field plate electrode FP. The gate insulating film GI is formed in the inside of the trench TR on the insulating film IF1. An insulating film IF2 is formed on an upper surface and a side surface of the field plate electrode FP exposed from the insulating film IF1. The gate electrode GE is also formed between the field plate electrode FP exposed from the insulating film IF1 and the semiconductor substrate SUB via the gate insulating film GI and the insulating film IF2.

The insulating film IF1 is formed between the semiconductor substrate SUB and the field plate electrode FP. The insulating film IF2 is formed between the gate electrode GE and the field plate electrode FP. The gate insulating film GI is formed between the semiconductor substrate SUB and the gate electrode GE. The semiconductor substrate SUB, the gate electrode GE, and the field plate electrode FP are electrically insulated from each other by the insulating films.

The gate electrode GE and the field plate electrode FP are made of, for example, a poly-crystalline silicon film into which an impurity of n-type is doped (introduced). The insulating film IF1, the insulating film IF2, and the gate insulating film GI are made of, for example, a silicon oxide film. The thickness of the insulating film IF1 is larger than the thickness of each of the insulating film IF2 and the gate insulating film GI. The thickness of the insulating film IF1 is, for example, 400 nm to 600 nm. The thickness of each of the insulating film IF2 and the gate insulating film GI is, for example, 50 nm to 80 nm.

A body area PB of p-type is formed in the semiconductor substrate SUB at the upper surface of the semiconductor substrate SUB so as to be shallower than the depth of the trench TR. A source region NS of n-type is formed in the body region PB. The source region NS has a higher impurity concentration than the drift region NV.

On the lower surface of the semiconductor substrate SUB, an n-type drain region ND is formed in the semiconductor substrate SUB. The drain region ND has a higher impurity concentration than the drift region NV. A drain electrode DE is formed under the lower surface of the semiconductor substrate SUB. The drain electrode DE consist of a single layer of metallic membranes, such as aluminum membranes, titanium membranes, nickel membranes, gold membranes or silver membranes, or laminated membranes with these metallic membranes laminated accordingly. The drain region ND and the drain electrode DE are formed over the cell region CR and the outer peripheral region OR. The drain potential is supplied to the semiconductor substrate SUB (drain region ND, drift region NV) from the drain electrode DE.

An interlayer insulating film IL is formed on upper surface of the semiconductor substrate SUB so as to cover the trench TR. The interlayer insulating film IL is formed of, for example, a silicon oxide film. The thickness of the interlayer insulating film IL is, for example, 700 nm to 900 nm.

A hole CH1 reaching to each of the source region NS and the body region PB is formed in the interlayer insulating film IL. A high concentration diffused region PR is formed in the body region PB at the bottom portion of the hole CH1. The high concentration diffused region PR has a higher impurity concentration than the body region PB.

A source electrode SE is formed on the interlayer insulating film IL. The source electrode SE is embedded in the hole CH1, is electrically connected to the source region NS, the body region PB, and the highly diffused region PR, and supplies a source potential to these impurity regions.

As shown in B-B cross-section of FIG. 5, a portion of the field plate electrode FP forms a contact portion FPa of the field plate electrode FP. The position of the insulating film IF1 in contact with the field plate electrode FP other than the contact portion FPa is lower than the position of upper surface of the insulating film IF1 in contact with the contact portion FPa. That is, the position of upper surface of the insulating film IF1 of A-A cross section is located at a depth of 300 nm to 400 nm from the upper surface of the semiconductor substrate SUB. The position of upper surface of the insulating film IF1 in B-B cross section is located at a depth of 50 nm to 100 nm from the upper surface of the semiconductor substrate SUB.

In addition, the position of the upper surface of the contact portion FPa is higher than the position of the upper surface of the semiconductor substrate SUB, and is located at a height 200 nm to 400 nm from the upper surface of the semiconductor substrate SUB.

A hole CH3 reaching the contact portion FPa is formed in the interlayer insulating film IL. The source electrode SE is embedded in the hole CH3, electrically connected to the field plate electrode FP, and supplies a source potential to the field plate electrode FP. The cross-sectional configuration of the trench TR in the outer peripheral region OR is also the same as B-B cross-section. A hole CH3 is also formed on a part of the field plate electrode FP in the outer peripheral region OR. Therefore, the source electrode SE is electrically connected to the field plate electrode FP of the outer peripheral region OR, and the source potential is supplied thereto.

Although not illustrated here, a hole CH2 reaching the gate electrode GE is formed in the interlayer insulating film IL. Further, a gate wiring GW is formed on the interlayer insulating film IL. The gate wiring GW is embedded in the hole CH2, electrically connected to the gate electrode GE, and supplies a gate potential to the gate electrode GE.

The source electrode SE and the gate wiring GW include, for example, a barrier metal film and a conductive film formed on the barrier metal film. The barrier metal film is, for example, a titanium nitride film, and the conductive film is, for example, an aluminum film.

Note that the source electrode SE and the gate-wiring GW may include a plug-layer filling the inside of the hole CH1~CH3 and a wiring layer formed on the interlayer insulating film IL. In this case, the wiring layer includes the barrier metal film and the conductive film. The plug layer is formed of, for example, a stacked film of a barrier metal film such as a titanium nitride film and a conductive film such as a tungsten film.

<Method of Manufacturing Semiconductor Device>

Each manufacturing step (manufacturing process) included in a method of manufacturing the semiconductor device 100 will be described below with reference to FIGS. 6 to 19.

Figure 6:
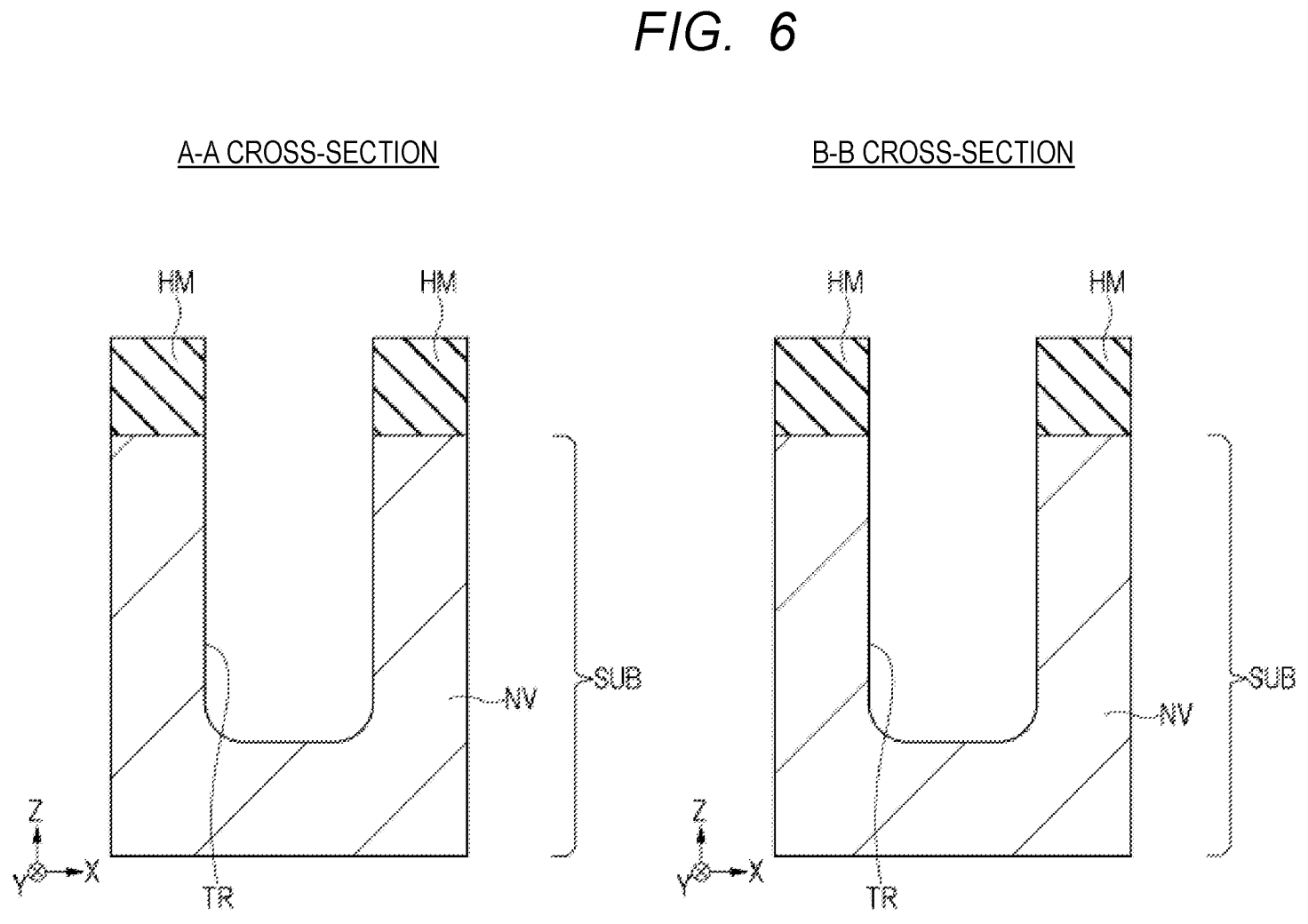

As shown in FIG. 6, first, the semiconductor substrate SUB of n-type having an upper surface and a lower surface is provided. As described above, the semiconductor substrate SUB of n-type constitutes the drift region NV, but the drift region NV may be a semiconductor layer of n-type grown on a silicon substrate of n-type while introducing phosphorus (P) by an epitaxial growth method.

Next, in the semiconductor substrate SUB at upper surface of TR, a trench is formed. In order to form the trench TR, for example, a silicon oxide film is first formed on the semiconductor substrate SUB by, for example, a CVD method. Next, a resist pattern having an opening is formed on the silicon oxide film by a photolithography technique. Next, an anisotropic etching treatment is performed using the resist pattern as a mask, whereby the silicon oxide film is patterned to form a hard mask HM. Next, the resist pattern is removed by performing an asking treatment. Next, an anisotropic etching treatment is performed using the hard mask HM as a mask to form a trench TR in the semiconductor substrate SUB. Thereafter, the hard mask HM is removed by, for example, a wet etching treatment using a hydrofluoric acid-containing solution.

Figure 7:
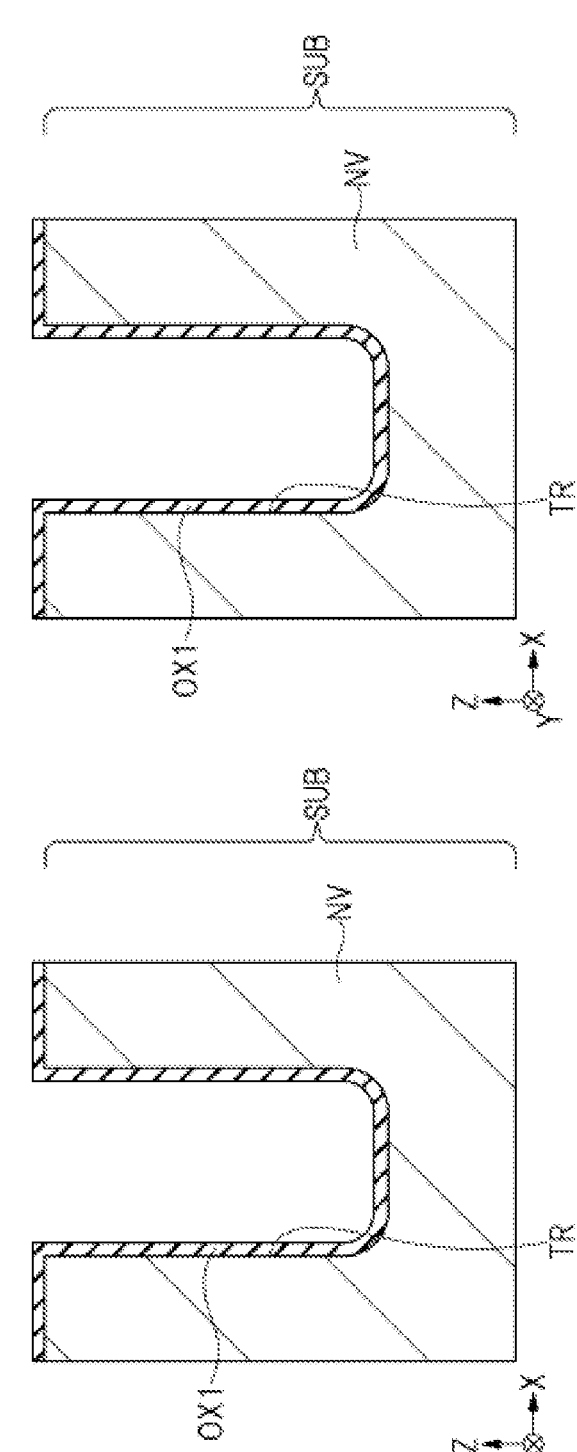
FIG. 7 is a cross-sectional view showing a manufacturing process of the semiconductor device following FIG. 6.

As shown in FIG. 7, a silicon oxide film OX1 is formed in the inside of the trench TR and on the semiconductor substrate SUB by, for example, a thermal oxidation treatment. The thermal oxidation treatment performed here is performed under conditions of 1000 degrees Celsius or higher and 1100 degrees Celsius or lower using oxygen gas. The thickness of the silicon oxide film OX1 is, for example, 50 nm to 150 nm.

Figure 8:
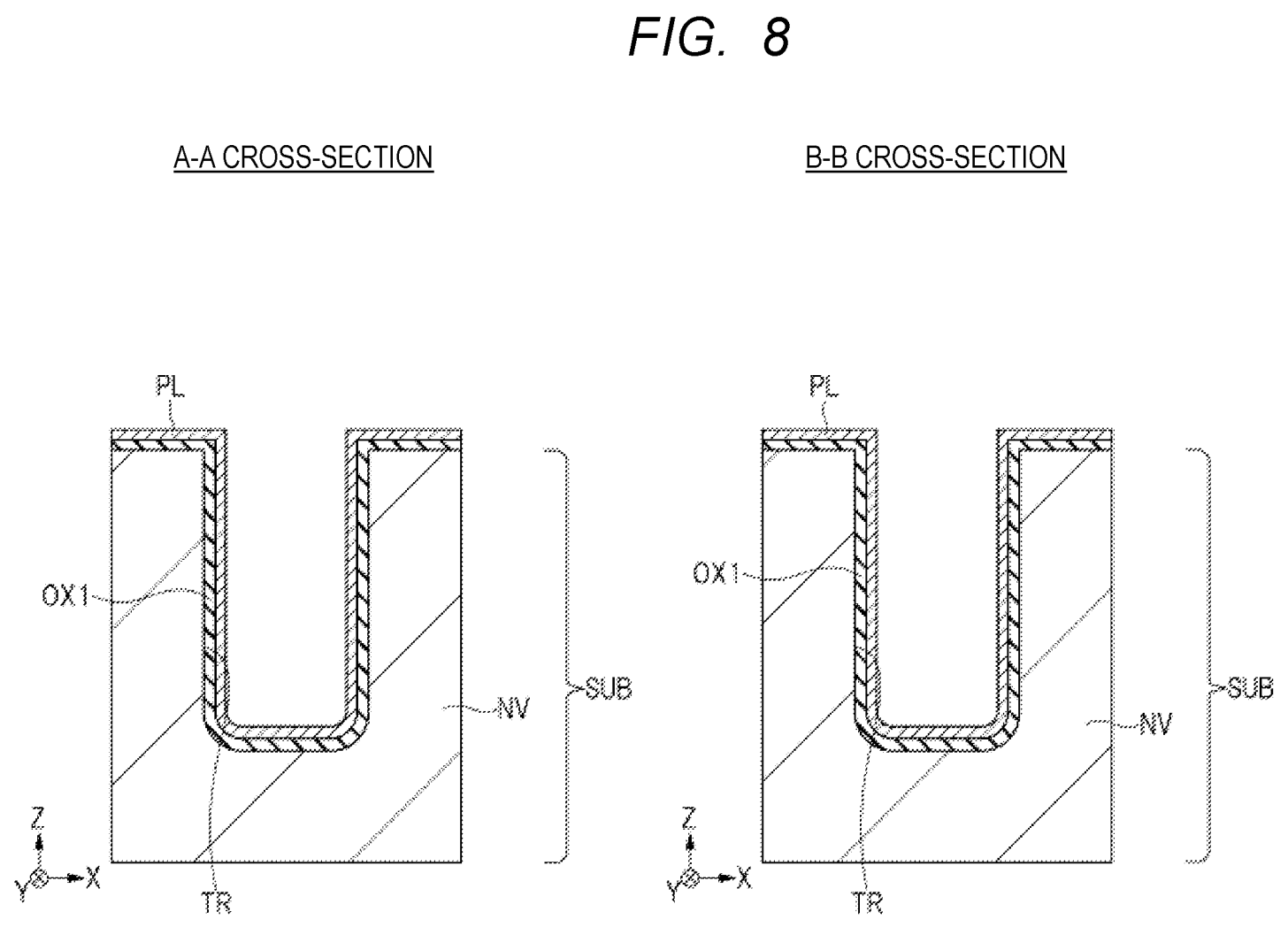

As shown in FIG. 8, a poly-crystalline silicon film PL is formed on the silicon oxide film OX1. An n-type impurity is introduced into the poly-crystalline silicon film PL, and the impurity density thereof is, for example, $4.0 \times 10^{20}$ cm$^{-3}$. The thickness of the poly-crystalline silicon film PL is, for example, 150 nm to 250 nm.

The poly-crystalline silicon film PL can be formed by, for example, a CVD method. An example of the forming condition of the poly-crystalline silicon film PL is described below. A mixed gas of silane ($SiH_4$) and phosphine ($PH_3$) is flowed into the chamber at 580 degrees Celsius in CVD device chamber. Thus, the poly-crystalline silicon film PL in which the n-type impurity is introduced can be formed.

Figure 9:
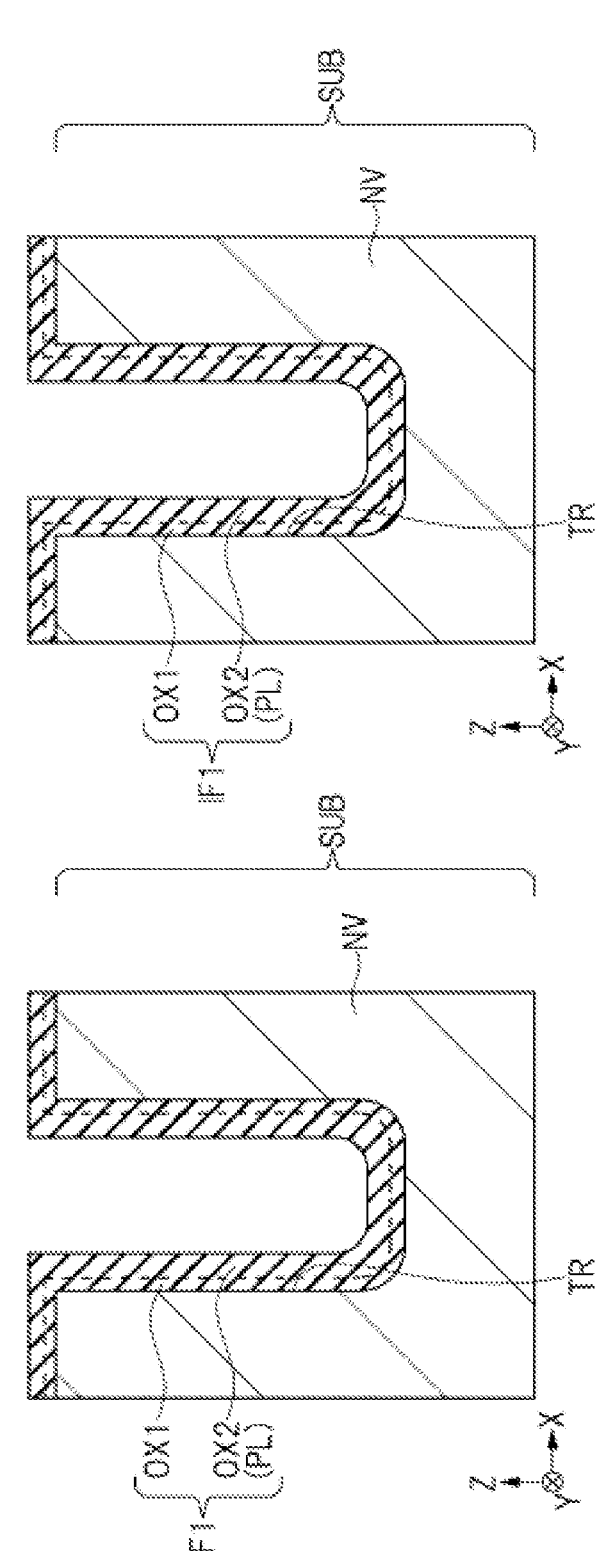
FIG. 9 is a cross-sectional view showing a manufacturing process of the semiconductor device following FIG. 8.

As shown in FIG. 9, the poly-crystalline silicon film PL is subjected to a thermal oxidation treatment to form a silicon oxide film OX2 from the poly-crystalline silicon film PL. The thermal oxidation treatment is performed by using a steam and under a condition of 750 degrees Celsius to 950 degrees Celsius. The thickness of the silicon oxide film OX2 is, for example, 350 nm to 450 nm. As a result, an insulating film IF1 including the silicon oxide film OX1 and the silicon oxide film OX2 is formed as an insulating film for electrically isolating the field plate electrodes FP and the semiconductor substrate SUB.

Figure 10:
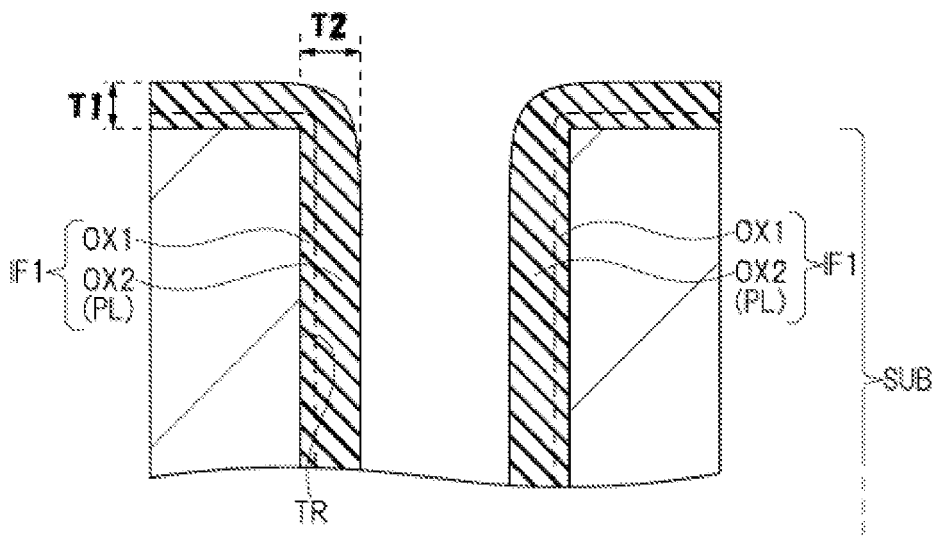
FIG. 10 is an enlarged cross-sectional view showing a main portion of the manufacturing process of the semiconductor device shown in FIG. 9.
Figure 26:
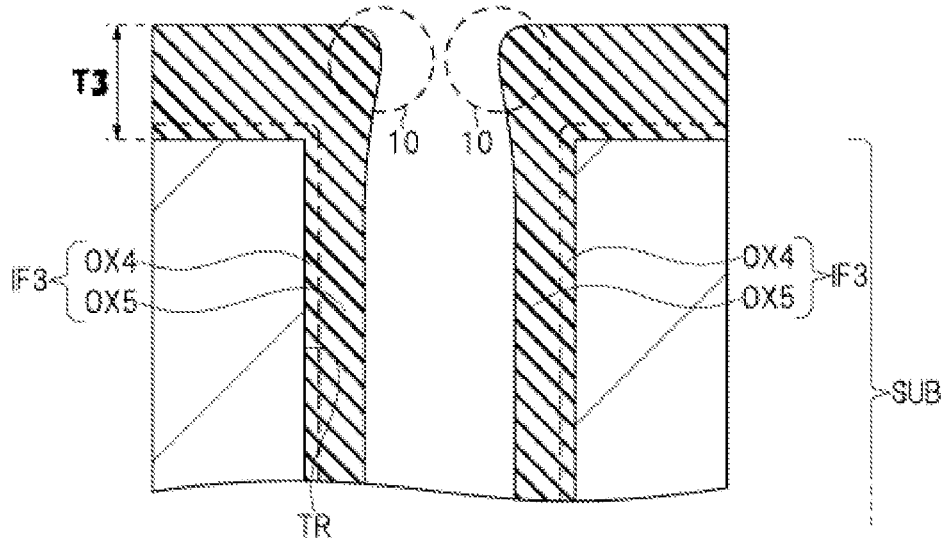
FIG. 26 is a cross-sectional view showing a manufacturing process of a semiconductor device according to an examined example.
Figure 27:
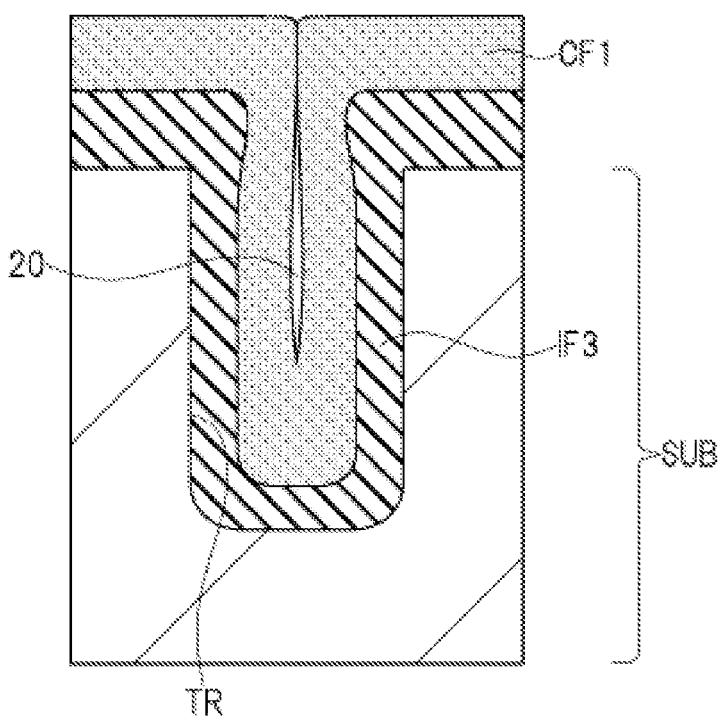
FIG. 27 is a cross-sectional view showing a manufacturing process of the semiconductor device following FIG. 26.
Figure 28:
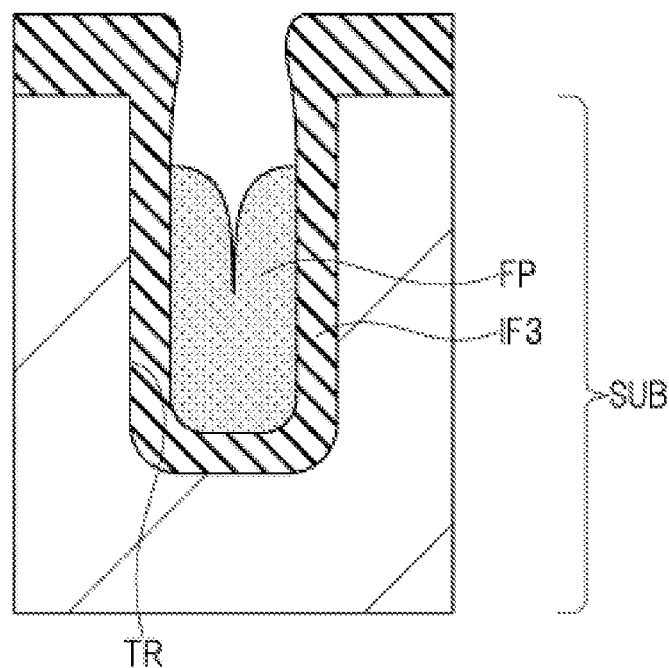
FIG. 28 is a cross-sectional view showing a manufacturing process of the semiconductor device following FIG. 27.
Figure 29:
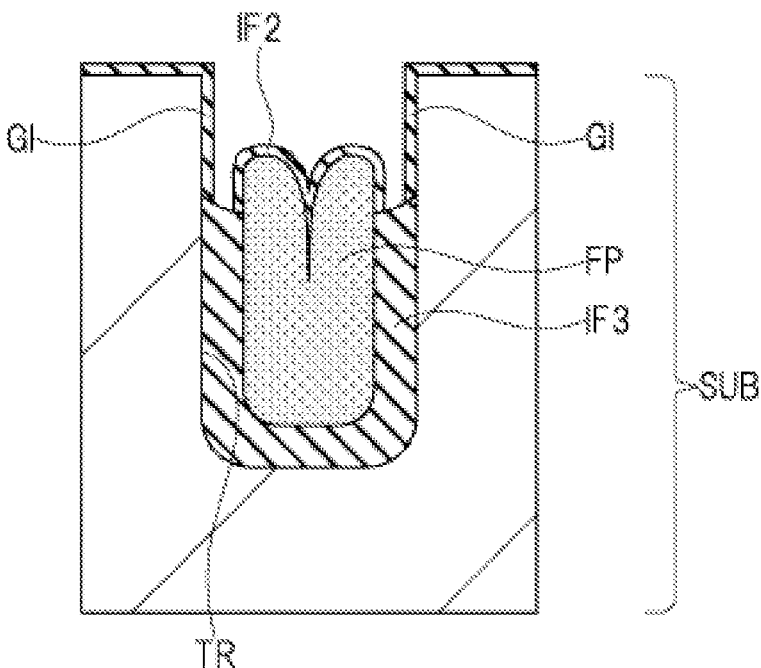
FIG. 29 is a cross-sectional view showing a manufacturing process of the semiconductor device following FIG. 28.

FIG. 10 is an enlarged cross-sectional view of the upper portion of the trench TR shown in FIG. 9. In the insulating film IF1, the overhang portion 10 such as examined example insulating film IF3 of FIG. 26 is not formed. Therefore, when the conductive film CF1 for the field plate electrode FP described later is formed, the generation of the gap 20 can be suppressed.

In the examined example, there is an issue that the dielectric strength between the field plate electrode FP and the gate electrode GE is easily deteriorated due to the concentration of the electric field at the upper portion (in particular, at a protrusion portion described below) of the field plate electrode FP by processing the upper portion of the field plate electrode FP like the protrusion portion due to the generation of the gap 20. In addition, in the examined example, there is another issue that the crystalline defect is easily occurred in the semiconductor substrate SUB due to the expansion of the field plate electrode FP by the insulating film IF2 formed along the gap 20 at the inside of the field plate electrode FP. The first embodiment can resolve these issues, and thus, the first embodiment can improve the reliability of the semiconductor device 100.

As described above, in the first embodiment, the poly-crystalline silicon film PL is formed by CVD method. According to studies conducted by the inventors of the present application, it has been found that the formation of the poly-crystalline silicon film PL by CVD method is more likely to be formed flat than the formation of the silicon oxide film OX5 by examined example method, and it is difficult to shape the poly-crystalline silicon film CVD like the overhang portion 10.

In addition, in the examined example, in order to form a silicon oxide film OX5 having a thickness of, for example, 400 nm on the side surface of the trench TR, a silicon oxide film OX5 having a thickness of about 750 nm needs to be deposited in consideration of the coverage of the CVD method. Therefore, the thickness T3 of the silicon oxide film OX5 on the upper surface of the semiconductor substrate SUB becomes thicker than the thickness of the silicon oxide film OX5 on the side surface of the trench TR, thereby the overhang portion 10 is likely to be generated. However, the coverage of the poly-crystalline silicon in CVD method is higher than that of silicon oxide, and further, in the first embodiment, the thickness of the poly-crystalline silicon film PL can be thinly formed to be, for example, 150 nm to 250 nm. Since the thickness at the time of film formation by CVD method is thinner in the first embodiment than in examined example, the overhang portion 10 is less likely to be generated. By oxidizing the poly-crystalline silicon film PL, a silicon oxide film OX2 having a thickness equivalent to the thickness of the silicon oxide film OX5 of the trench TR sidewall of examined example can be formed.

When the silicon oxide film OX2 is formed by the method of the first embodiment, the thickness of the silicon oxide film OX2 on the upper surface of the semiconductor substrate SUB is approximately equal to the thickness of the silicon oxide film OX2 in the inside of the trench TR. Therefore, the thickness T1 of the insulating film IF1 on the upper surface of the semiconductor substrate SUB has substantially the same thickness as the thickness T2 of the insulating film IF1 in the inside of the trench TR. In the examined example of FIG. 26, the thickness of the insulating film IF3 on the upper surface of the semiconductor substrate SUB is the thickness T3, but the thickness T1 is smaller than the thickness T3.

When the conductive film CF1 is embedded in the trench TR to be described later, the smaller the thickness T1 of the insulating film IF1 on the upper surface of the semiconductor substrate SUB is, the lower the aspect ratio is. Therefore, the conductive film CF1 is easily buried in the trench TR.

In addition, when the insulating film IF1 to be described later is retreated, the insulating film IF1 on the upper surface of the semiconductor substrate SUB is removed, but the thickness T1 thereof is thin, so that the wet etching treatment can be shortened.

Although a poly-crystalline silicon film PL of n-type is exemplified in the first embodiment, the poly-crystalline silicon film PL may be non-doped silicon. Even in this case, the silicon oxide film OX2 can be formed by performing the above-described thermal oxidation treatment. However, when an impurity is introduced into the poly-crystalline silicon film PL, the silicon oxide film OX2 can be formed by using accelerated oxidation. That is, the oxidation rate of the poly-crystalline silicon film into which the impurity is introduced is higher than the oxidation rate of the poly-crystalline silicon film into which the impurity is not introduced. Therefore, since the speed of forming the silicon oxide film OX2 can be increased, it is possible to shorten the duration of the above-described thermal oxidation treatment.

In addition, when the poly-crystalline silicon film PL of n-type is applied, there is a possibility that the impurities diffuse into the semiconductor substrate SUB during the above-described thermal oxidation treatment. As a result, the impurity profiles of the drift region NV, the body-region PB, and the source region NS may vary. However, since the silicon oxide film OX1 is present between the poly-crystalline silicon film PL and the semiconductor substrate SUB, it is possible to prevent such impurities from diffusing. That is, the silicon oxide film OX1 not only serves to improve the interface state but also serves to prevent the diffusion of impurities.

Figure 11:
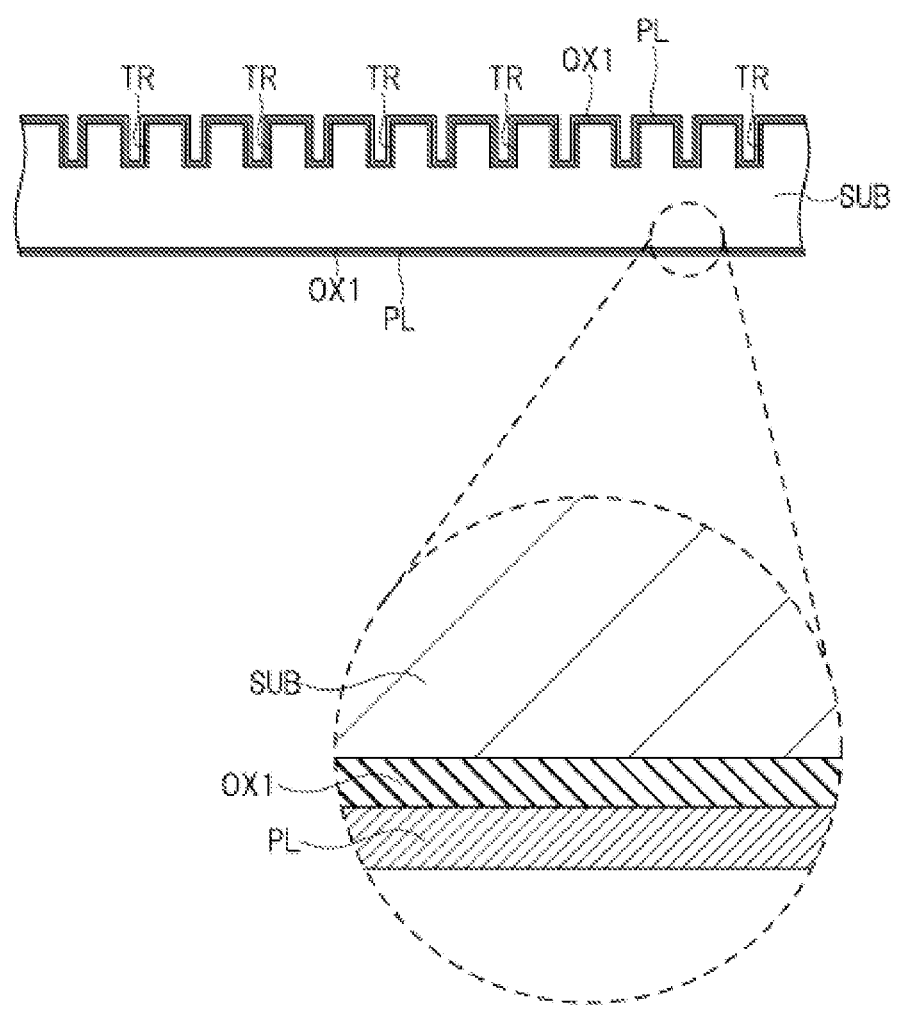
FIG. 11 is a cross-section view showing a state of a semiconductor substrate shown in FIG. 8.

FIG. 11 is a cross-sectional view showing a state of the semiconductor substrate SUB shown in FIG. 8. That is, FIG. 11 shows a condition after forming the poly-crystalline silicon film PL and before forming the silicon oxide film OX2. In FIG. 11, the vicinity of the lower surface of the semiconductor substrate SUB is shown in an enlarged manner, such as an area surrounded by a broken line.

The silicon oxide film OX1 and the poly-crystalline silicon film PL are actually formed not only on the upper surface of the semiconductor substrate SUB but also on the lower surface of the semiconductor substrate SUB. When the poly-crystalline silicon film PL is subjected to thermal oxidation treatment in this condition, a silicon oxide film OX2 is also formed on the lower surface of the semiconductor substrate SUB. Then, the warpage of the semiconductor substrate SUB in the wafer condition varies depending on OX2 of the silicon oxide film on the lower surface. The warpage of the semiconductor substrate SUB can be adjusted by removing the poly-crystalline silicon film PL on the lower surface of the semiconductor substrate SUB prior to the thermal oxidation treatment. For example, the amount of warpage of the semiconductor substrate SUB can be reduced.

Figure 12:
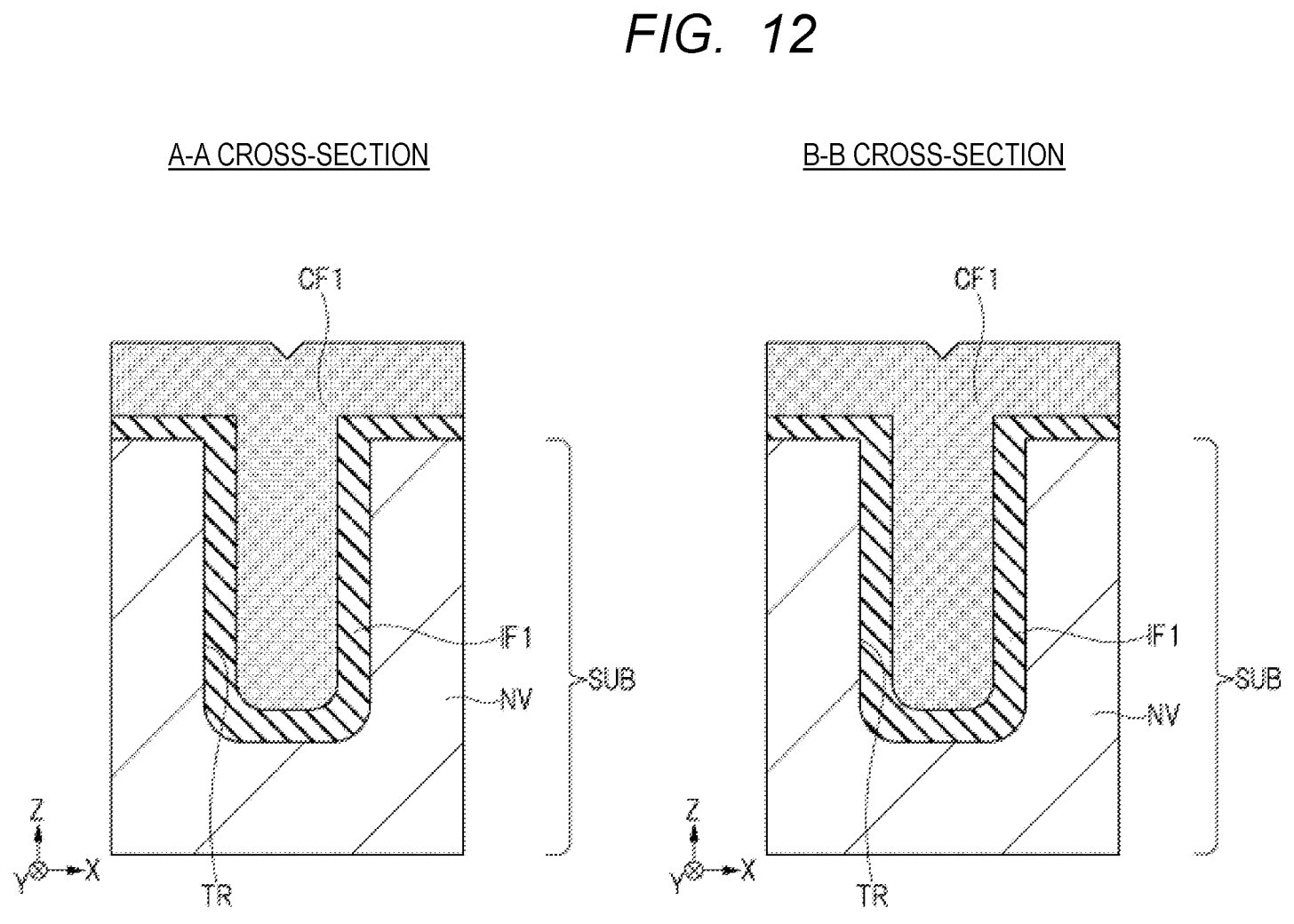

FIG. 12 is a cross-sectional view showing a manufacturing process of the semiconductor device following FIG. 9. As shown in FIG. 12, the conductive film CF1 is formed by, for example, a CVD method so as to fill the inside of the trench TR via the insulating film IF1. The conductive film CF1 is, for example, an n-type poly-crystalline silicon film. The thickness of the conductive film CF1 is, for example, 400 nm to 600 nm.

As described above, in the first embodiment, since the overhang portion 10 such as examined example insulating film IF3 is not formed, it is possible to suppress the generation of the gap 20 when the conductive film CF1 is formed. In addition, in the first embodiment, since the thickness T1 of the insulating film IF1 on the upper surface of the semiconductor substrate SUB is thinner than in examined example, the aspect-ratio is reduced. Therefore, the conductive film CF1 is easily buried in the trench TR.

Figure 13:
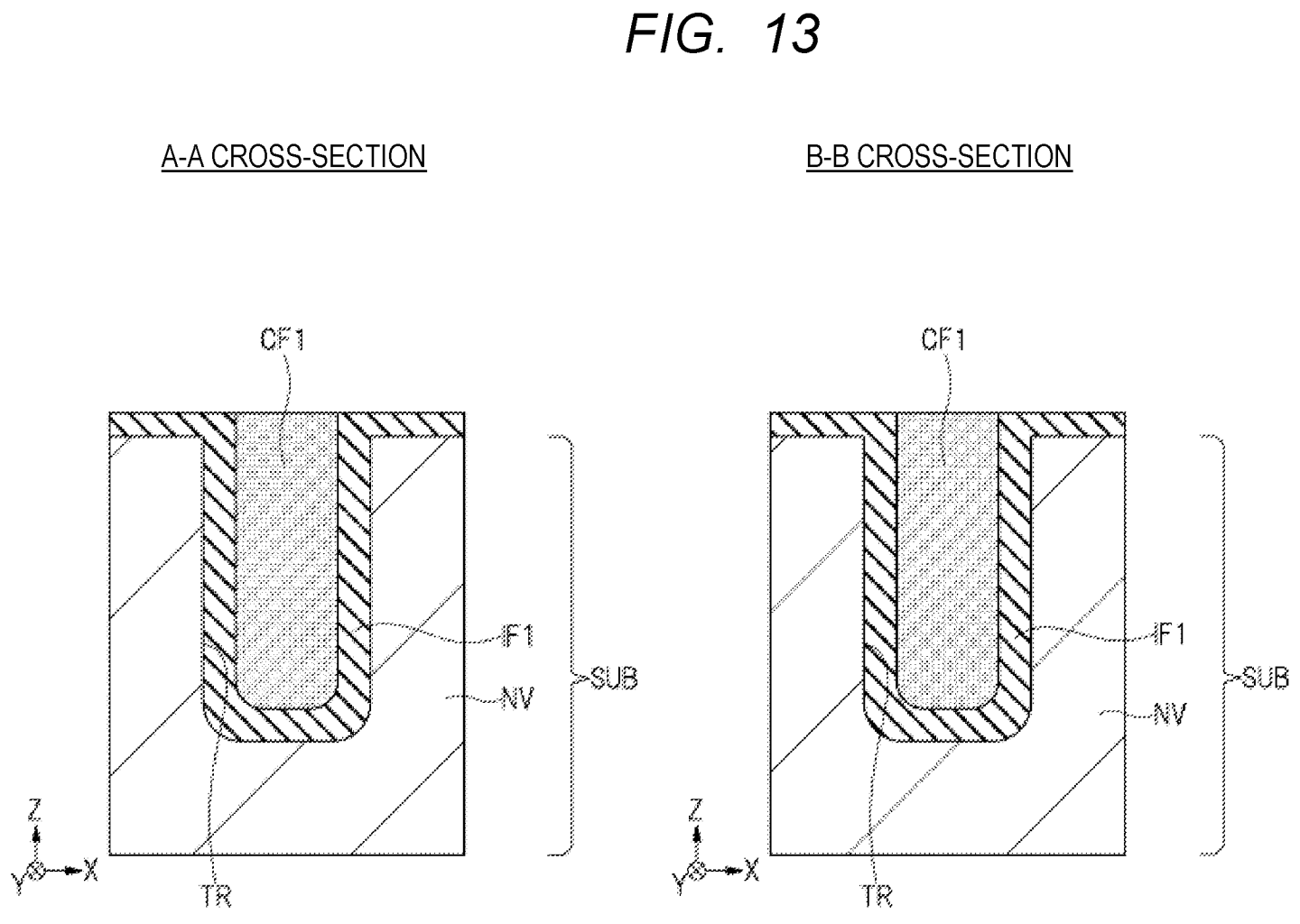

As shown in FIG. 13, the conductive film CF1 formed outside the trench TR is removed by performing a polishing treatment using, for example, a CMP (Chemical Mechanical Polishing) method or an anisotropic etching treatment. At this point, the position of the upper surface of the conductive film CF1 is substantially the same as the position of the upper surface of the insulating film IF1 of the semiconductor substrate SUB.

Figure 14:
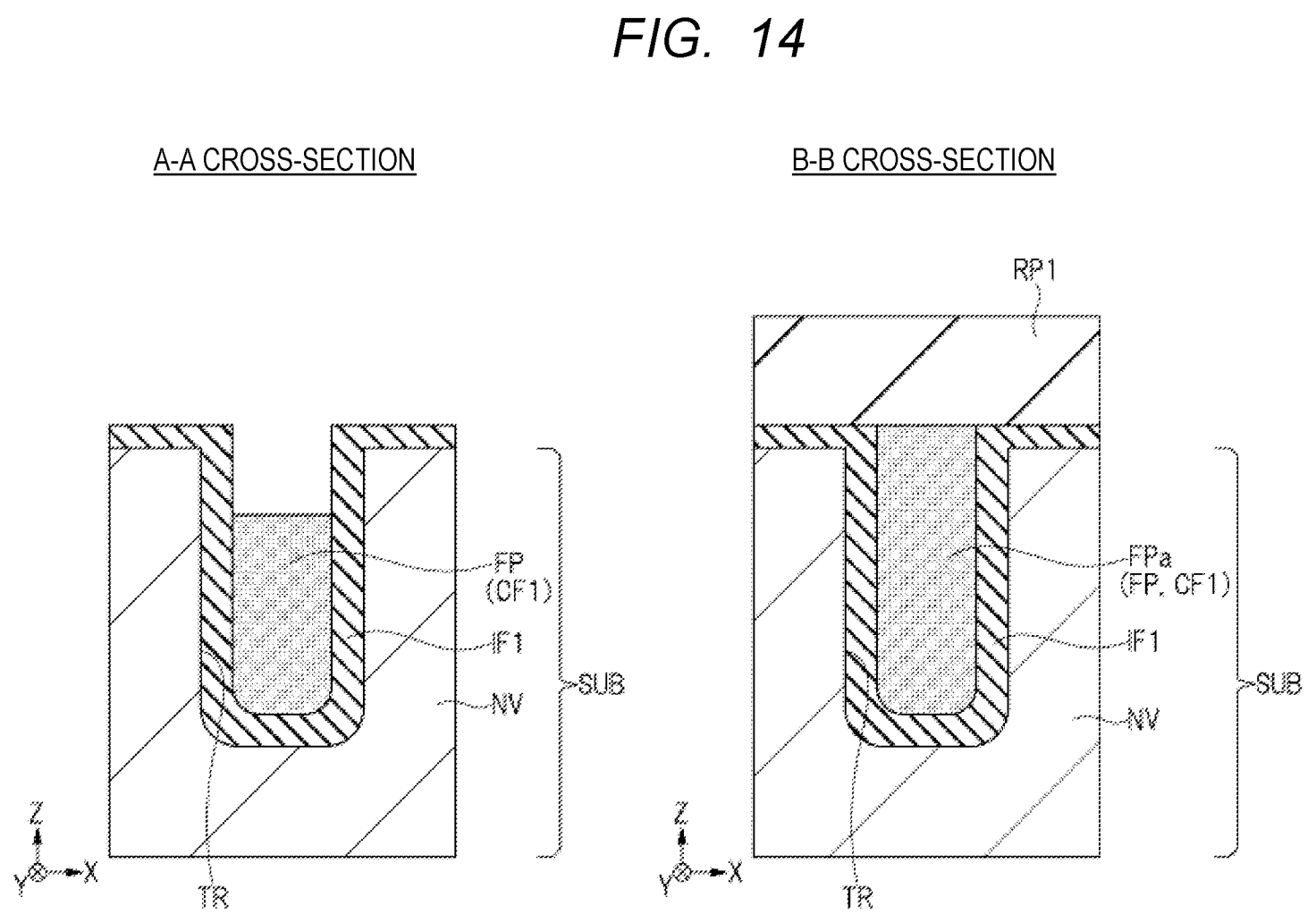

As shown in FIG. 14, the other portion of the conductive film CF1 is selectively retreated such that a portion of the conductive film CF1 remains as a contact portion FPa. First, as shown in B-B cross-section, a resist pattern RP1 is formed to selectively cover the regions to be the contact portions FPa. Next, the conductive film CF1 is patterned by performing an anisotropic etching treatment using the resist pattern RP1 as a mask. That is, as shown in A-A cross section, the other portion of the conductive film CF1 is selectively retreated. As a result, the other part of the conductive film CF1 that has been retreated is formed as the field plate electrode FP, and a portion of the conductive film CF1 that has not been retreated becomes the contact portion FPa. Thereafter, the resist pattern RP1 is removed by performing an asking treatment.

Figure 15:
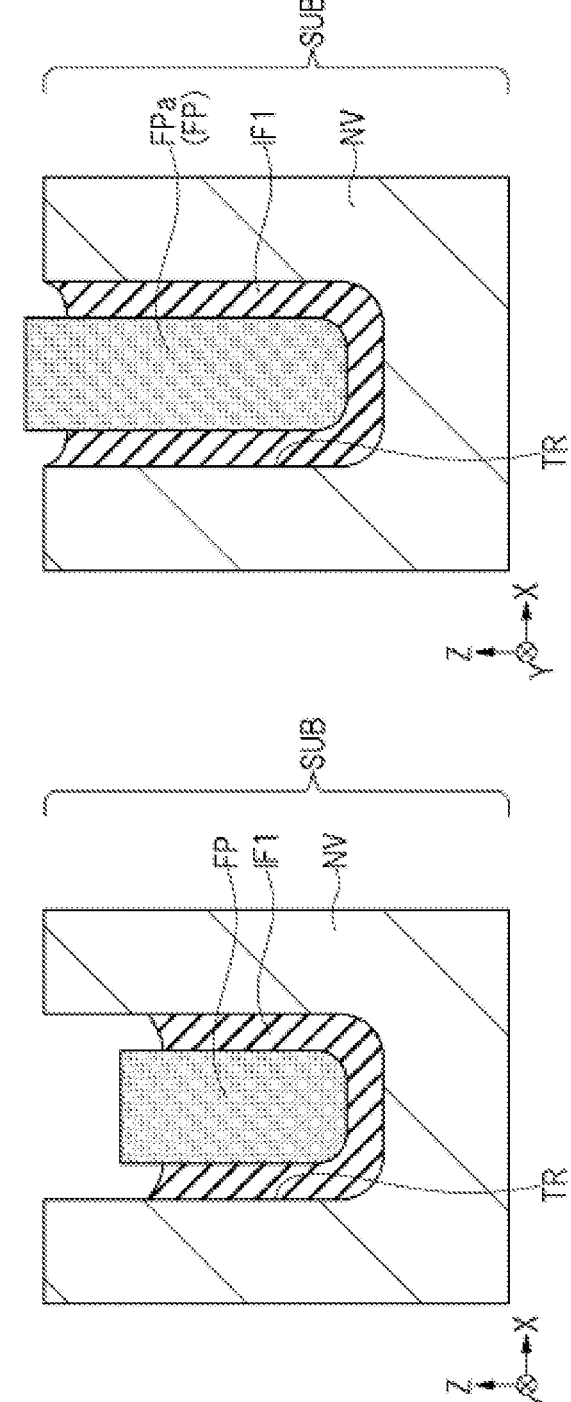
FIG. 15 is a cross-sectional view showing a manufacturing process of the semiconductor device following FIG. 14.

As shown in FIG. 15, the insulating film IF1 on the semiconductor substrate SUB is removed by, for example, a wet etching treatment using a solution containing hydrofluoric acid, and the insulating film IF1 is retreated in the inside of the trench TR. As a result, the position of the upper surface of the insulating film IF1 in the trench TR is lower than the position of the upper surface of the field plate electrode FP.

In A-A cross-section, since the field plate electrode FP has the upper surface retreated, the insulating film TR has the insulating film IF1 directly exposed to the wet etching treatment, and therefore, after the wet etching treatment, the position of upper surface of the insulating film IF1 in contact with the contact portion FPa is lower than the position of upper surface of the insulating film IF1 in contact with the field plate electrode FP other than the contact portion OOG. Further, by removing the insulating film IF1 on the semiconductor substrate SUB, the position of FPa of the contact portion upper surface becomes higher than the position of the upper surface of the semiconductor substrate SUB.

Figure 16:
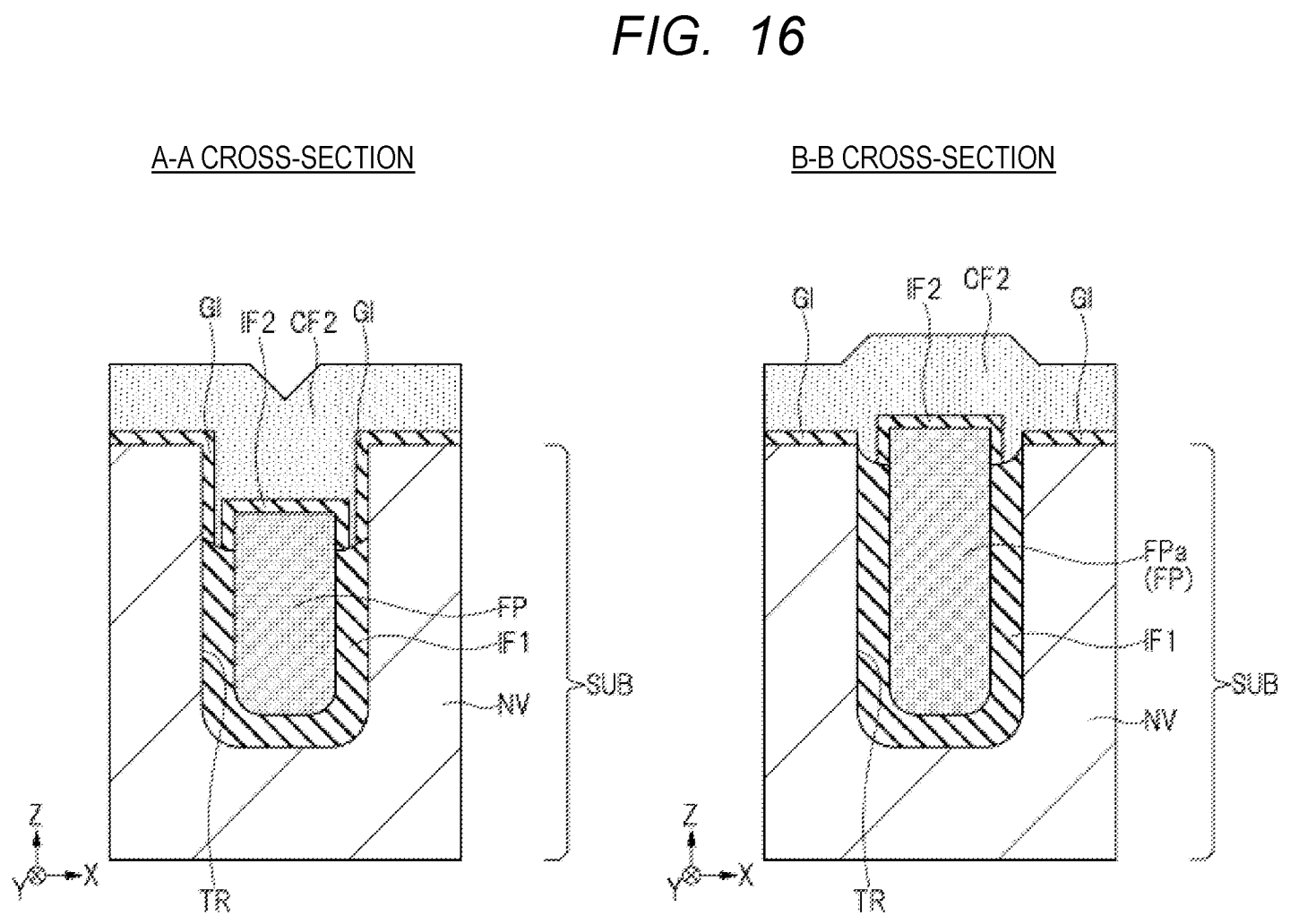

As shown in FIG. 16, first, a gate insulating film GI made of a silicon oxide film is formed in the inside of the trench TR on the insulating film IF1 and on the upper surface of the semiconductor substrate SUB by the thermal oxidation treatment. At the same time, an insulating film IF2 made of a silicon oxide film is formed on the upper surface and the side surface of the field plate electrode FP exposed from the insulating film IF1.

Next, a conductive film CF2 is formed on the semiconductor substrate SUB by, e.g., CVD so as to cover the trench TR. The conductive film CF2 is, for example, an n-type poly-crystalline silicon film.

Figure 17:
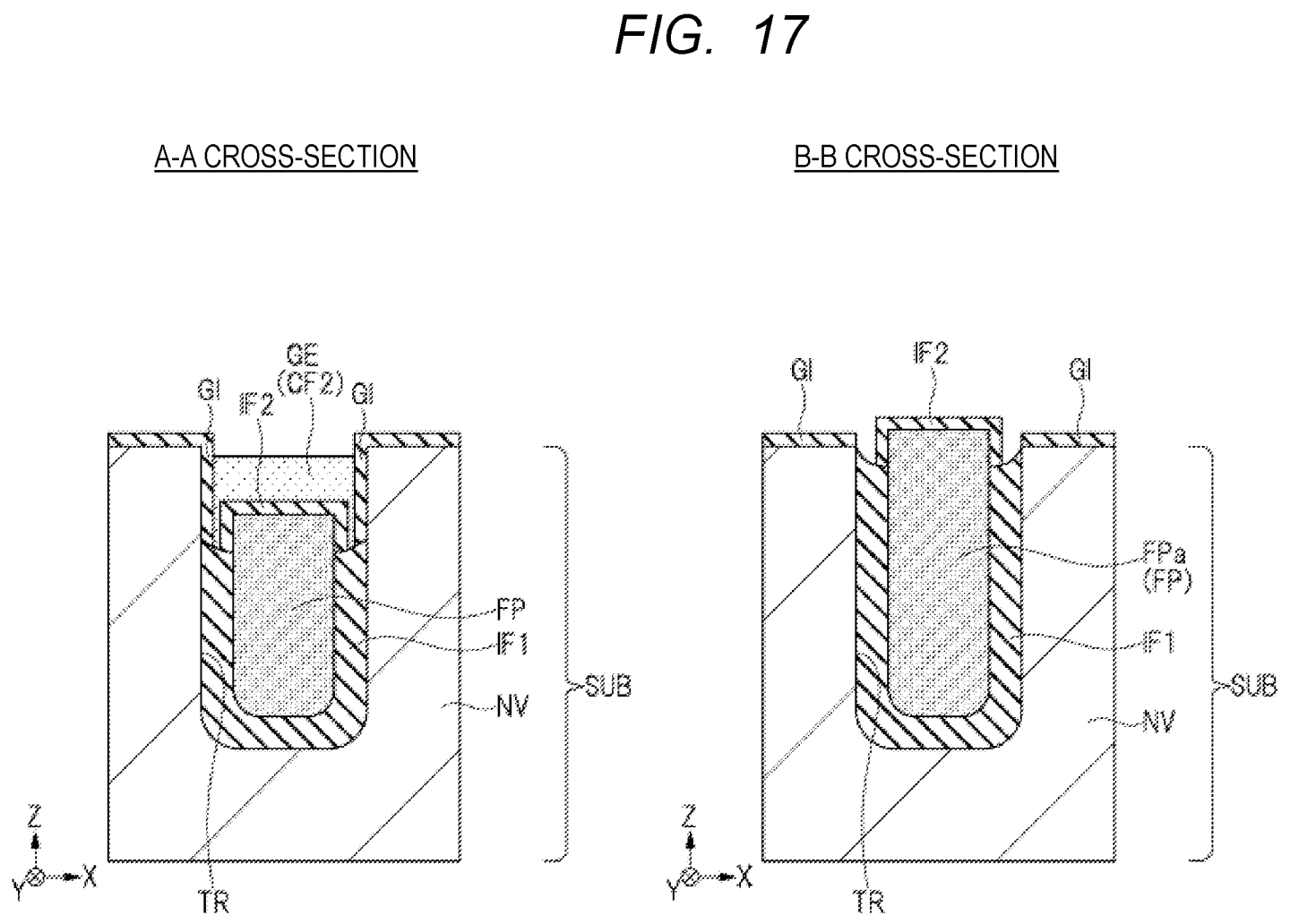

As shown in FIG. 17, the conductive film CF2 formed outside the trench TR is removed by performing an anisotropic dry etching treatment on the conductive film CF2. Accordingly, the gate electrode GE is formed on the field plate electrode FP so as to fill the inside of the trench TR.

By this anisotropic dry etching treatment, the conductive film CF2 is removed in the inside of the trench TR in which the contact portion FPa is formed. In order to prevent a short circuit between the contact portion FPa for the gate and the source region NS, since the anisotropic dry etching treatment is performed by overetching in order to completely remove the unwanted conductive film CF2, the position of upper surface of the gate electrode GE is slightly lower than the position of the upper surface of the semiconductor substrate SUB. At this point in time, the semiconductor substrate SUB, the gate electrode GE, and the field plate electrode FP (contact portion FPa) are insulated from each other in the trench TR.

Figure 18:
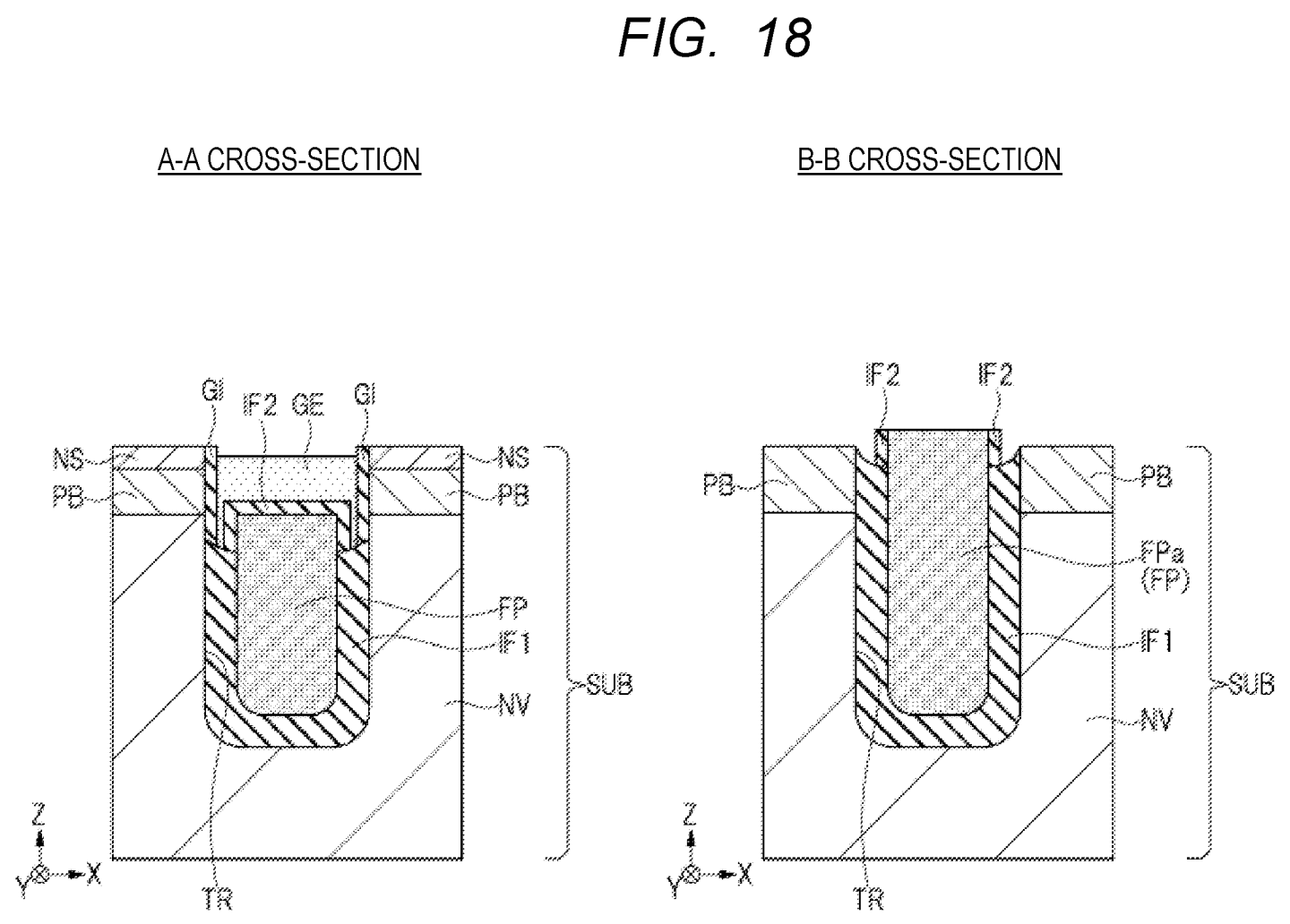

As shown in FIG. 18, the gate insulating film GI on the upper surface of the semiconductor substrate SUB and the insulating film IF2 on upper surface of the field plate electrode FP are removed by the anisotropic etching treatment.

Then, in the semiconductor substrate SUB, a p-type body area PB is selectively formed by introducing boron (B) into the upper surface of the semiconductor substrate SUB by photolithography and ion implantation. The body regions PB are formed to be shallower than the depth of the trench TR.

Next, an n-type source region NS is selectively formed in the body region PB of the cell region CR by introducing, for example, arsenic (As) by photolithography and ion-implantation. Note that the source region NS is not formed in the body region PB adjoining the contact portion FPa. Thereafter, the semiconductor substrate SUB is subjected to a heat treatment to diffuse impurities contained in the source region NS and the body region PB.

Figure 19:
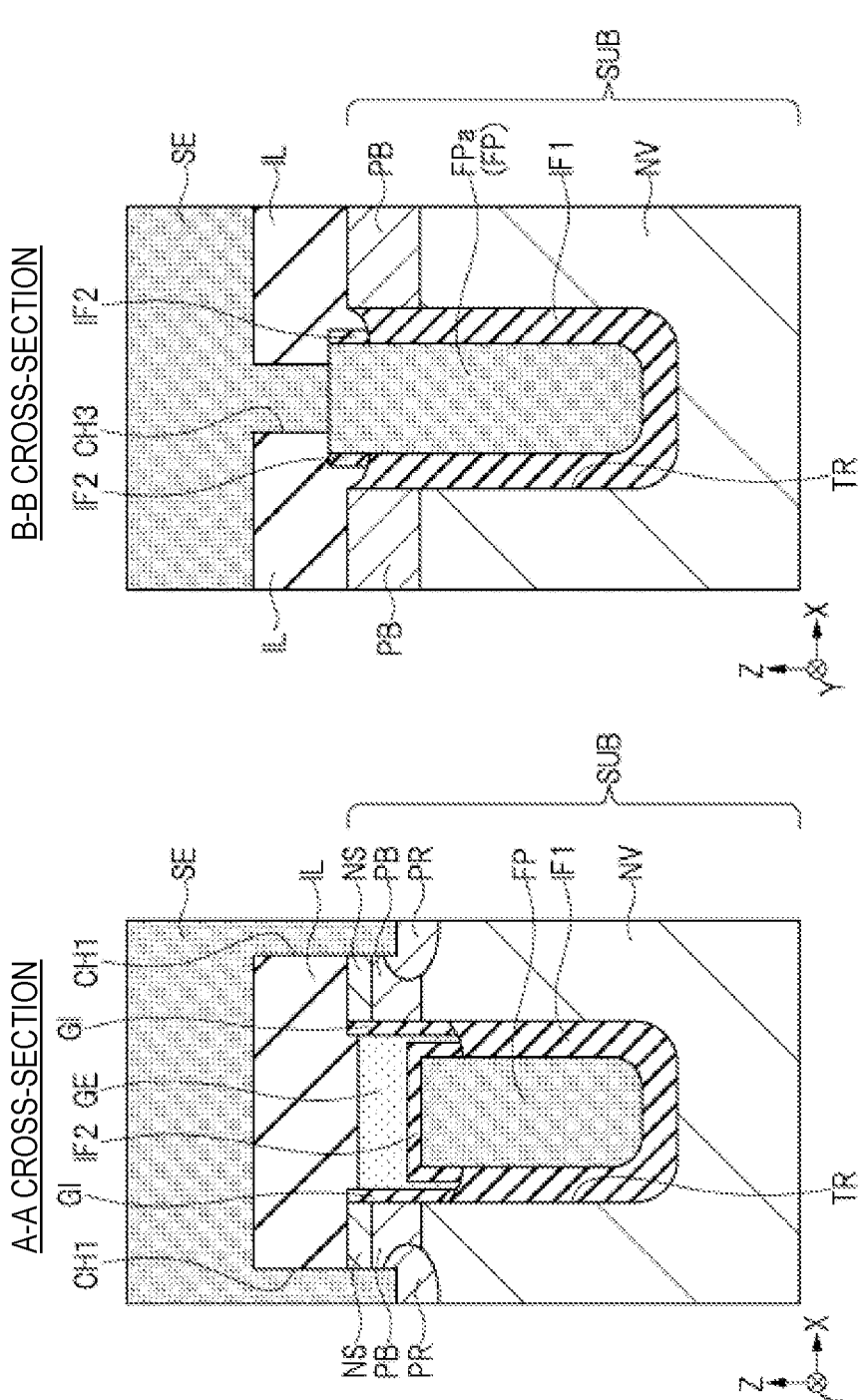
FIG. 19 is a cross-sectional view showing a manufacturing process of the semiconductor device following FIG. 18.

As shown in FIG. 19, the interlayer insulating film IL is formed on the upper surface of the semiconductor substrate SUB by, for example, a CVD method so as to cover the trench TR. The interlayer insulating film IL is formed of, for example, a silicon oxide film. The interlayer insulating film IL may be a laminated film of a thin silicon oxide film formed by a CVD method and a PSG film formed by a coating method.

Next, a hole CH1~CH3 is formed in the interlayer insulating film IL. First, on the interlayer insulating film IL, a resist pattern having a pattern for opening the semiconductor substrate SUB in which the source-region NS is formed is formed. Next, an anisotropic etching treatment is performed using the resist pattern as a mask to form a hole CH1 that reaches the source region NS and the body region PB in the interlayer insulating film IL. The bottom portion of the hole CH1 is located in the body area PB. Next, a p-type highly diffused region PR is formed by introducing, for example, boron (B) into the body region PB at the bottom portion of the hole CH1 by the ion-implantation method. Thereafter, the resist pattern is removed by performing an ashing treatment.

Next, on the interlayer insulating film IL, a resist pattern having a pattern opening on the gate electrode GE and the contact portion FPa of the outer peripheral region OR is formed. Next, an anisotropic etching treatment is performed using the resist pattern as a mask to form a hole CH2 reaching the gate electrode GE and a hole CH3 reaching the contact portion FPa in the interlayer insulating film IL. Thereafter, the resist pattern is removed by performing an ashing treatment.

Next, the source electrode SE and the gate wiring GW are formed on the interlayer insulating film IL. First, a stacked film of a barrier metal film made of, for example, a titanium nitride film and a conductive film made of, for example, an aluminum film is formed on the interlayer insulating film IL by a sputtering method or a CVD method. Next, the stacked film is patterned to form the source electrode SE and the gate wiring GW.

The gate wiring GW is embedded in the hole CH2 and electrically connected to the gate electrode GE. The source electrode SE is embedded in the hole CH1 and the hole CH3, and is electrically connected to the source region NS, the body region PB, the highly diffused region PR, and the field plate electrode FP.

Note that the source electrode SE and the gate wiring GW may include a plug layer filling the inside of the hole CH1~CH3 and a wiring layer formed on the interlayer insulating film IL. First, a first barrier metal film made of, for example, a titanium nitride film is formed on the inside of the hole CH1~CH3 and the interlayer insulating film IL by a sputtering method or a CVD method. Next, a first conductive film made of, for example, a tungsten film is formed on the first barrier metal film by a CVD method. Next, the first barrier metal film and the first conductive film formed outside the hole CH1~CH3 are removed by a CMP method or an anisotropic etching treatment. As a result, the first barrier metal film and the first conductive film are formed so as to fill the inside of the hole CH1~CH3.

Next, a stacked film of a second barrier metal film made of, for example, a titanium nitride film and a second conductive film made of, for example, an aluminum film is formed on the interlayer insulating film IL by a sputtering method or a CVD method. Next, the stacked film is patterned to form a wiring layer electrically connected to the plug layer.

Next, although not illustrated here, a protective film made of, for example, a polyimide film is formed on the source electrode SE and the gate wiring GW by, for example, a coating method. By forming an opening in a part of the protective film, regions of the source electrode SE and the gate wiring GW that become the source pad SP and the gate pad GP are exposed.

Thereafter, the structure shown in FIG. 5 is obtained through the following manufacturing process. First, the lower surface of the semiconductor substrate SUB is polished as needed. Next, an n-type drain-region ND is formed by introducing, for example, arsenic (As) or the like into the lower surface of the semiconductor substrate SUB by ion-implantation. Next, the drain electrode DE is formed under the lower surface of the semiconductor substrate SUB by a sputtering method.

First Modified Example

Figure 20:
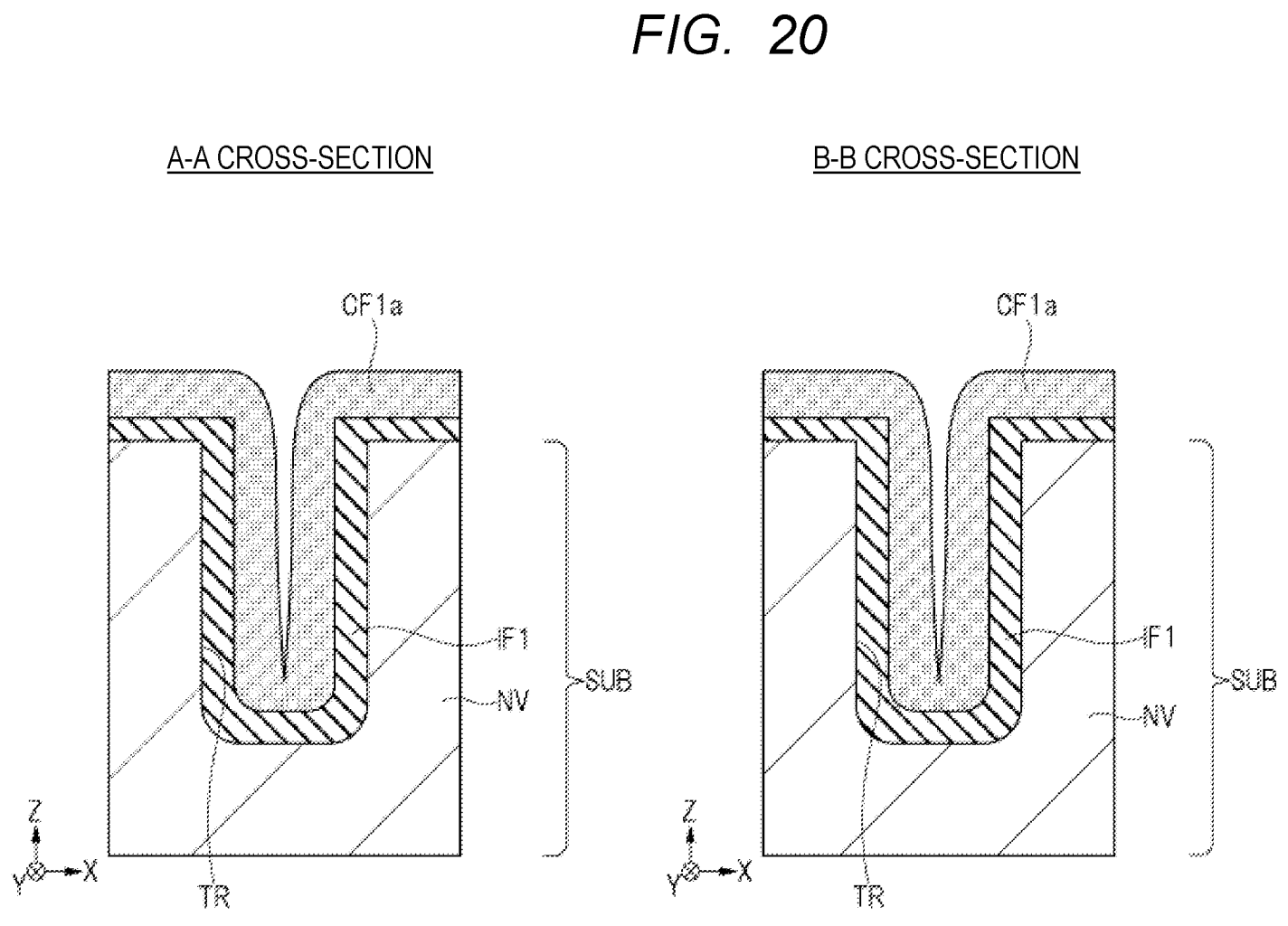
Figure 21:
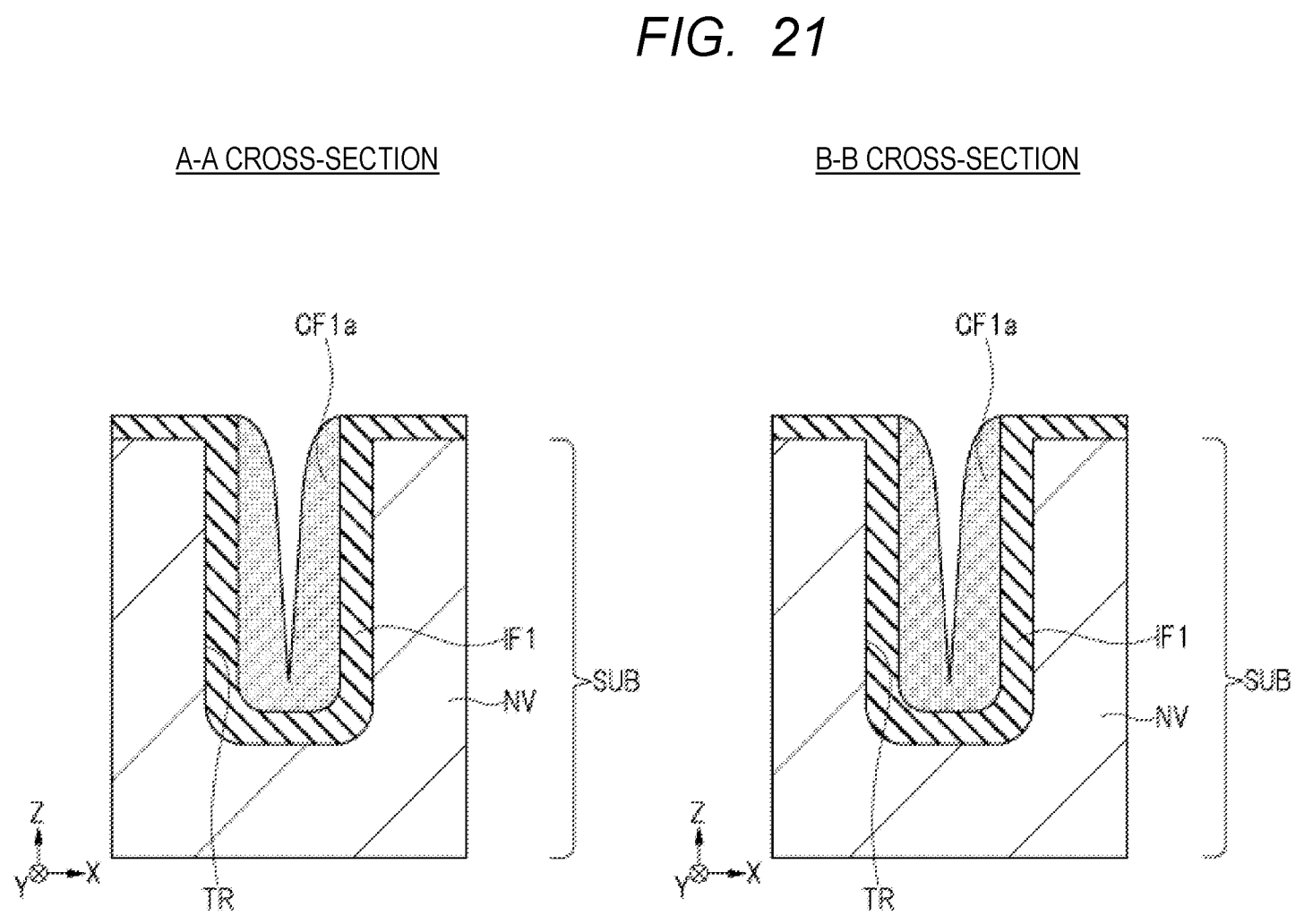
Figure 22:
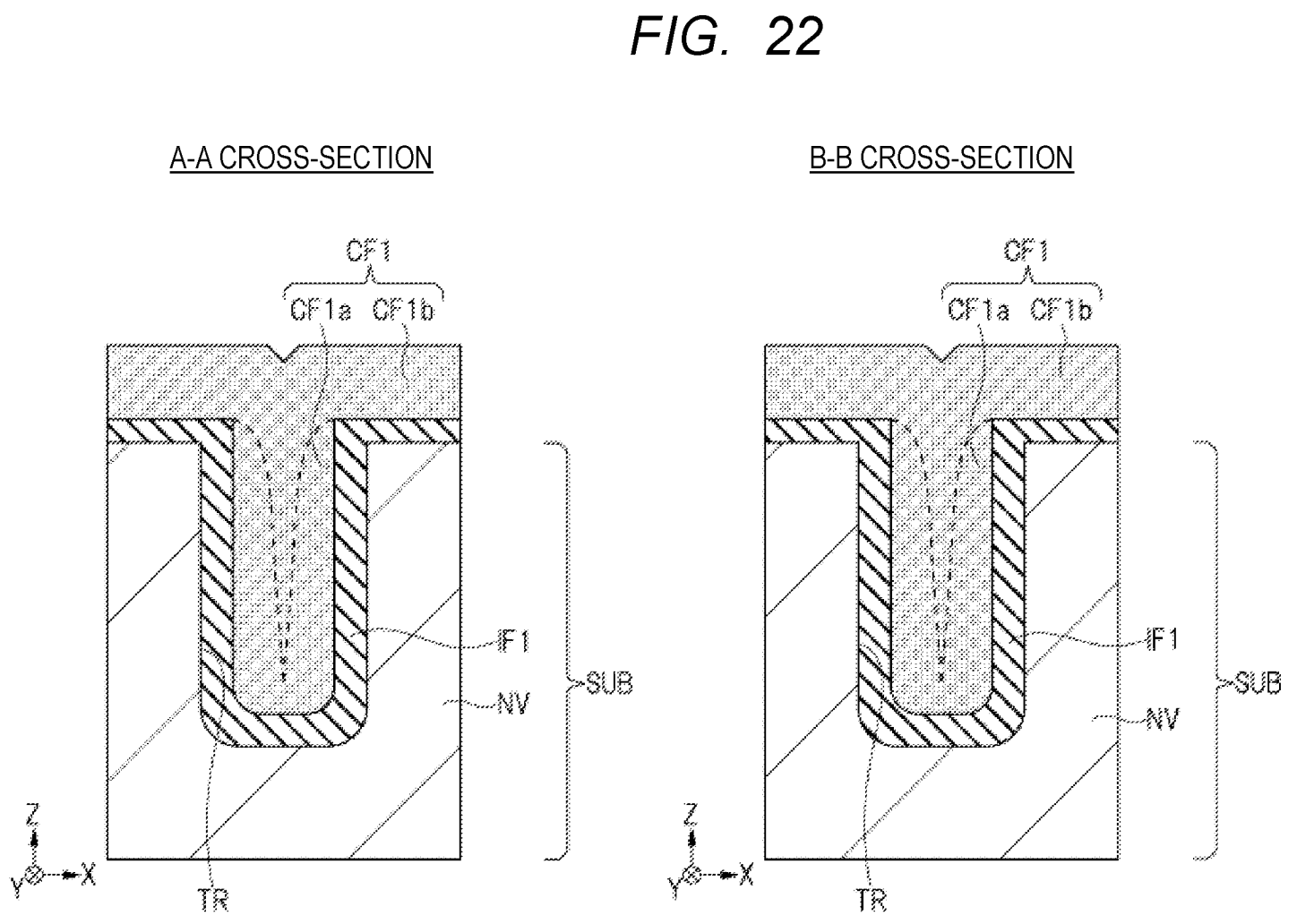

Hereinafter, each manufacturing step (manufacturing process) included in a method of manufacturing the semiconductor device 100 in a first modified example will be described with reference to FIGS. 20 to 22. FIG. 20 to FIG. 22 are a manufacturing step performed in place of FIG. 12 shown in the first embodiment.

In the first embodiment, a conductive film CF1 is embedded in the inside of the trench TR by a CVD method performing one time. In the first modified example, a conductive film CF1 is embedded in the inside of the trench TR by a CVD method performing multiple times.

As shown in FIG. 20, a conductive film CF1a is formed on the insulating film IF1 by, for example, a CVD method. The conductive film CF1a is, for example, a poly-crystalline silicon film of n-type. At this time, the inside of the trench TR is not completely buried by the conductive film CF1a. The conductive film CF1b is also formed on the insulating film IF1 outside the trench TR. The thickness of the conductive film CF1a is, for example, 200 nm to 300 nm.

As shown in FIG. 21, the thickness of the conductive film CF1a is reduced by performing an anisotropic etching treatment on the conductive film CF1a. Since the conductive film CF1 is processed in a side surface shape in the inside of the trench TR, the thickness of the conductive film CF1a becomes thinner as it approaches the uppermost portion of the trench TR. Note that the conductive film CF1a formed outside the trench TR is removed.

As shown in FIG. 22, the conductive film CF1b is formed by, for example, a CVD method so as to fill the inside of the trench TR via the insulating film IF1 and the conductive film CF1a. The conductive film CF1b is also formed on the insulating film IF1 outside the trench TR. The conductive film CF2 is, for example, an n-type poly-crystalline silicon film. The thickness of the conductive film CF1b is, for example, 200 nm to 300 nm. The conductive film CF1 includes the conductive film CF1a and the conductive film CF1b formed in this manner. Subsequent manufacturing steps are the same as those of FIG. 13 and subsequent steps of the first embodiment.

In the manufacturing process of FIG. 21, since the thickness of the conductive film CF1a becomes thinner toward the uppermost portion of the trench TR, the aspect-ratio is reduced when the conductive film CF1b is formed. Therefore, as compared with the first embodiment, the gap 20 is less likely to be generated when the conductive film CF1b is formed, so that the reliability of the semiconductor device 100 can be further improved.

Here, although the manufacturing process by the two CVD method has been exemplified, the number of times may be three or more.

On the other hand, in the first embodiment, a conductive film CF1 is formed by a single CVD process. Therefore, the first modified example is superior to the first embodiment in terms of reduction of aspect-ratio. However, the first embodiment is superior to the first modified example in terms of simplification of manufacturing process.

Second Modified Example

Figure 23:
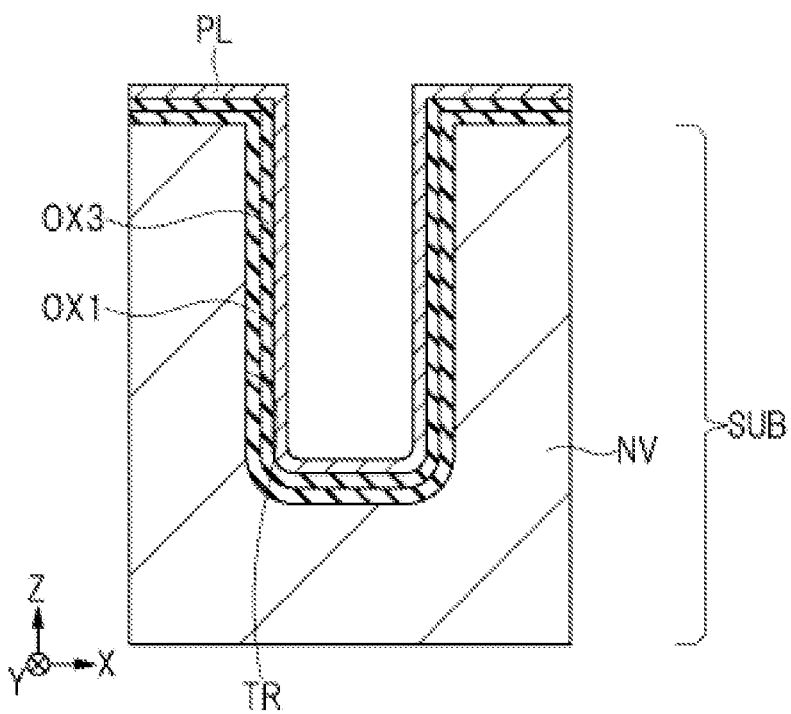
FIG. 23 is a cross-sectional view showing a manufacturing process of a semiconductor device according to a second modified example.

Hereinafter, each manufacturing step (manufacturing process) included in a method of manufacturing the semiconductor device 100 in a second modified example will be described with reference to FIG. 23.

In the second modified example, a silicon oxide film OX3 is formed between the silicon oxide film OX1 and the poly-crystalline silicon film PL. After the manufacturing process of FIG. 7, a silicon oxide film OX3 is formed on the silicon oxide film OX1 by a CVD method. Thereafter, in the manufacturing process of FIG. 8, a poly-crystalline silicon film PL is formed on the silicon oxide film OX3. The subsequent manufacturing process is the same as that of FIG. 9 and subsequent steps of the first embodiment. Accordingly, the insulating film IF1 of the second modified example includes a silicon oxide film OX1, a silicon oxide film OX3, and a silicon oxide film OX2 in which the poly-crystalline silicon film PL is oxidized.

In the second modified example, the thickness of the insulating film IF1 can be adjusted by forming the silicon oxide film OX3.

If the thickness of the silicon oxide film OX3 is too thick, the overhang portion 10 is likely to be formed because the silicon oxide film OX3 is formed by CVD method. Therefore, the thickness of the silicon oxide film OX3 is adjusted to such an extent that the overhang portion 10 is not formed. The thickness of the silicon oxide film OX3 is, for example, 50 nm to 150 nm, and is smaller than the thickness of the silicon oxide film OX2.

The silicon oxide film OX3 of the second modified example can also be applied to the first modified example.

Third Modified Example

Figure 24:
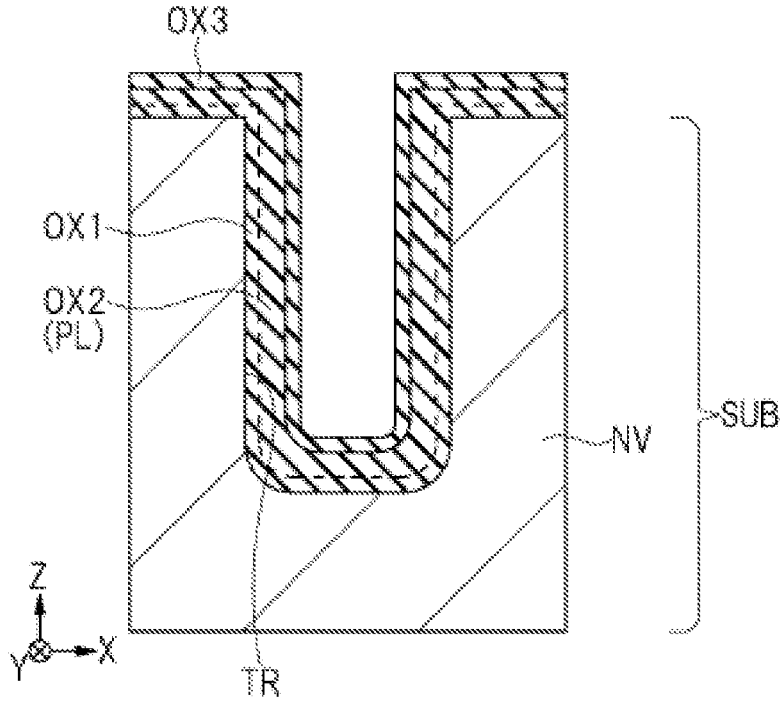
FIG. 24 is a cross-sectional view showing a manufacturing process of a semiconductor device according to a third modified example.

Hereinafter, each manufacturing step (manufacturing process) included in a method of manufacturing the semiconductor device 100 in a third modified example will be described with reference to FIG. 24.

In the third modified example, a silicon oxide film OX3 is formed after a silicon oxide film OX2 is formed by oxidizing a poly-crystalline silicon film PL. After the manufacturing process of FIG. 9, a silicon oxide film OX3 is formed on the silicon oxide film OX2 by a CVD method. The subsequent manufacturing process is the same as that of FIG. 12 and subsequent steps of the first embodiment. Accordingly, the insulating film IF1 of the third modified example includes a silicon oxide film OX1, a silicon oxide film OX2, and a silicon oxide film OX3.

In the third modified example as well as the second modified example, the thickness of the insulating film IF1 can be adjusted by forming the silicon oxide film OX3.

In the third modified example, the thickness of the silicon oxide film OX3 is adjusted to such an extent that the overhang portion 10 is not formed in the same manner as in the second modified example. The thickness of the silicon oxide film OX3 is, for example, 50 nm to 150 nm, and is smaller than the thickness of the silicon oxide film OX2.

The silicon oxide film OX3 of the third modified example can also be applied to the first modified example.

Fourth Modified Example

Figure 25:
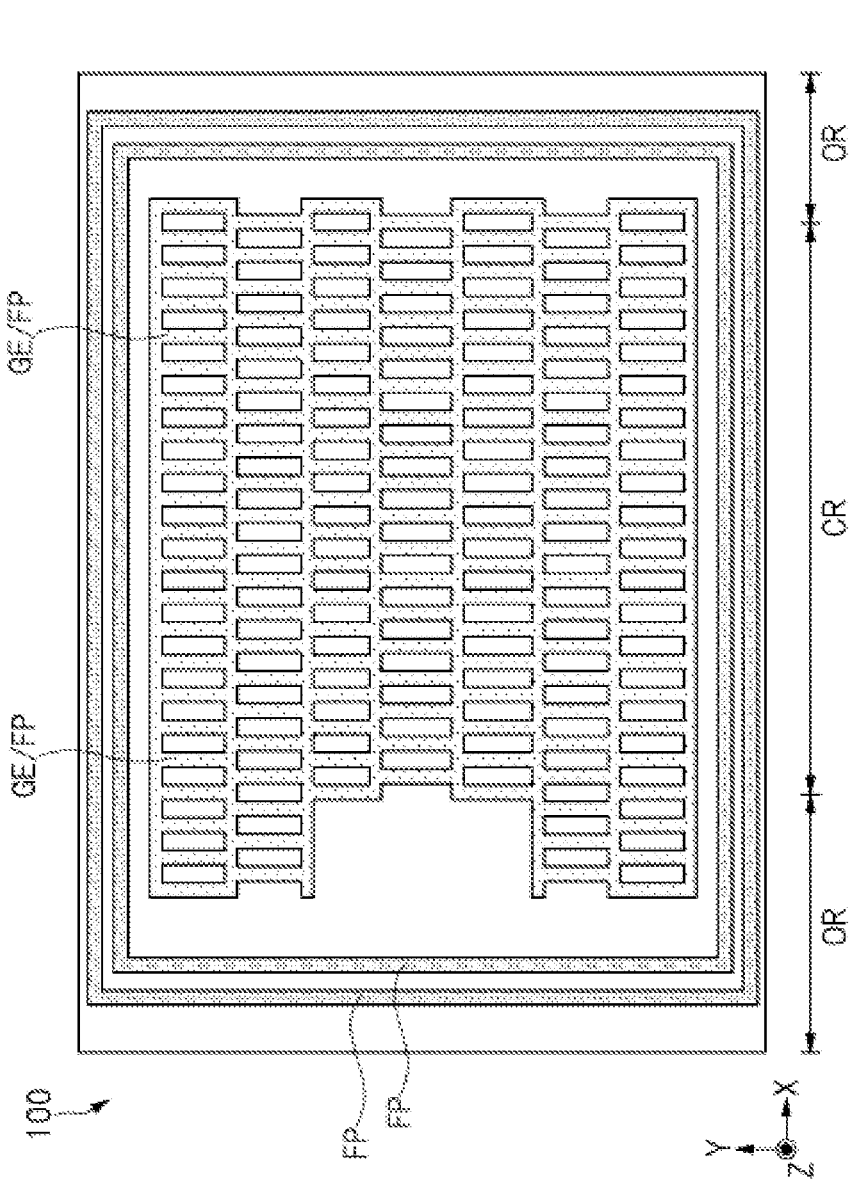
FIG. 25 is a cross-sectional view showing a manufacturing process of a semiconductor device according to a fourth modified example.

The semiconductor device 100 in a fourth modified example will be described below with reference to FIG. 25.

In the first embodiment, the plurality of trench TR extend in the Y-direction and are stripe-shaped. In the fourth modified example, there are portions extending in the X-direction in the plurality of trenches TR, and the plurality of trenches TR are connected to each other and are mesh-shaped.

Also, in the trench TR of the fourth modified example, the silicon oxide film OX2 formed by oxidizing the poly-crystalline silicon film PL can be applied to the insulating film IF1, and the reliability of the semiconductor device 100 can be improved.

Note that a plurality of mesh-like trenches TR disclosed in the fourth modified example can also be applied to the first through third modified examples.

Although the present invention has been described in detail based on the above-described embodiments, the present invention is not limited to the above-described embodiments, and can be various modified without departing from the gist thereof.

What is claimed is:

1. A method of manufacturing a semiconductor device, comprising steps of:

(a) providing a semiconductor substrate of a first conductivity type, the semiconductor substrate having an upper surface and a lower surface;

(b) forming a trench in the semiconductor substrate at the upper surface of the semiconductor substrate;

(c) forming a first silicon oxide film in an inside of the trench;

(d) forming a poly-crystalline silicon film on the first silicon oxide film;

(e) by performing a thermal oxidation treatment to the poly-crystalline silicon film and thereby forming a second silicon oxide film from the poly-crystalline silicon film, forming a first insulating film including the first silicon oxide film and the second silicon oxide film; and (f) forming a first conductive film so as to embed the inside of the trench via the first insulating film, wherein a thickness of the second silicon oxide film is greater than a thickness of the first silicon oxide film.

2. The method according to claim 1, further comprising steps of:

(g) after the step of (f), by retreating a portion of the first conductive film, forming the retreated first conductive film as a field plate electrode;

(h) after the step of (g), retreating the first insulating film to a position lower than an upper surface of the field plate electrode;

(i) after the step of (h), by a thermal oxidation treatment, forming a gate insulating film in the inside of the trench, which is located on the retreated first insulating film, and forming a second insulating film on the upper surface and a side surface of the field plate electrode, which are exposed from the retreated first insulating film;

(j) after the step of (i), forming a gate electrode on the field plate electrode so as to embed the inside of the trench;

(k) after the step of (j), forming a body region in the semiconductor substrate at the upper surface of the semiconductor substrate, a conductivity type of the body region being a second conductive type opposite the first conductive type;

(l) after the step of (k), forming a source region in the body region, a conductivity type of the source region being the first conductive type; and (m) after the step of (1), forming a drain region in the semiconductor substrate at the lower surface of the semiconductor substrate, a conductivity type of the drain region being the first conductive type.

3. The method according to claim 1, wherein, in the step of (d), the poly-crystalline silicon film into which an impurity of the first conductive type is introduced is formed by a CVD method.

4. The method according to claim 1, wherein, in the step of (d), the poly-crystalline silicon film is formed not only on the first silicon oxide film but also on the lower surface of the semiconductor substrate, the method according to claim 1, further comprising a step of:

(n) after the step of (d) and before the step of (e), removing the poly-crystalline silicon film formed on the lower surface of the semiconductor substrate.

5. The method according to claim 1, wherein, in the step of (e), the thermal oxidation treatment is performed by using a steam and under a condition of 750 degrees Celsius to 950 degrees Celsius.

6. The method according to claim 1, wherein the step of (f) includes steps of:

(f1) after the step of (e), in the inside of the trench, forming a second conductive film on the first insulating film;

(f2) after the step of (f1), reducing a thickness of the second conductive film by performing an anisotropic etching treatment to the second conductive film; and (f3) after the step of (f2), forming a third conductive film so as to embed the inside of the trench, and wherein the first conductive film includes the second conductive film and the third conductive film.

7. The method according to claim 1, wherein, in the step of (c), the first silicon oxide film is formed by a thermal oxidation treatment.

8. The method according to claim 7, further comprising a step of:

(o) after the step of (c) and before the step of (d), forming a third silicon oxide film on the first silicon oxide film by a CVD method, wherein, in the step of (d), the poly-crystalline silicon film is formed on the third silicon oxide film, wherein the first insulating film includes the first silicon oxide film, the second silicon oxide film and the third silicon oxide film, and wherein a thickness of the second silicon oxide film is greater than each of a thickness of the first silicon oxide film and a thickness of the third silicon oxide film.

9. The method according to claim 7, further comprising a step of:

(p) after the step of (e) and before the step of (f), forming a third silicon oxide film on the second silicon oxide film by a CVD method, wherein the first insulating film includes the first silicon oxide film, the second silicon oxide film and the third silicon oxide film, and wherein a thickness of the second silicon oxide film is greater than each of a thickness of the first silicon oxide film and a thickness of the third silicon oxide film.

10. A method of manufacturing a semiconductor device, comprising steps of:

(a) providing a semiconductor substrate of a first conductivity type, the semiconductor substrate having an upper surface and a lower surface;

(b) forming a trench in the semiconductor substrate at the upper surface of the semiconductor substrate;

(c) forming a first silicon oxide film in an inside of the trench;

(d) forming a poly-crystalline silicon film on the first silicon oxide film;

(e) by performing a thermal oxidation treatment to the poly-crystalline silicon film and thereby forming a second silicon oxide film from the poly-crystalline silicon film, forming a first insulating film including the first silicon oxide film and the second silicon oxide film; and (f) forming a first conductive film so as to embed the inside of the trench via the first insulating film, wherein, in the step of (d), the poly-crystalline silicon film is formed not only on the first silicon oxide film but also on the lower surface of the semiconductor substrate, (n) after the step of (d) and before the step of (e), removing the poly-crystalline silicon film formed on the lower surface of the semiconductor substrate.

11. The method according to claim 10, wherein, in the step of (c), the first silicon oxide film is formed by a thermal oxidation treatment.

12. The method according to claim 11, further comprising a step of:

(o) after the step of (c) and before the step of (d), forming a third silicon oxide film on the first silicon oxide film by a CVD method, wherein, in the step of (d), the poly-crystalline silicon film is formed on the third silicon oxide film, wherein the first insulating film includes the first silicon oxide film, the second silicon oxide film and the third silicon oxide film, and wherein a thickness of the second silicon oxide film is greater than each of a thickness of the first silicon oxide film and a thickness of the third silicon oxide film.

13. The method according to claim 11, further comprising a step of:

(p) after the step of (e) and before the step of (f), forming a third silicon oxide film on the second silicon oxide film by a CVD method, wherein the first insulating film includes the first silicon oxide film, the second silicon oxide film and the third silicon oxide film, and wherein a thickness of the second silicon oxide film is greater than each of a thickness of the first silicon oxide film and a thickness of the third silicon oxide film.

14. A method of manufacturing a semiconductor device, comprising steps of:

(a) providing a semiconductor substrate of a first conductivity type, the semiconductor substrate having an upper surface and a lower surface;

(b) forming a trench in the semiconductor substrate at the upper surface of the semiconductor substrate;

(c) forming a first silicon oxide film in an inside of the trench;

(d) forming a poly-crystalline silicon film on the first silicon oxide film;

(e) by performing a thermal oxidation treatment to the poly-crystalline silicon film and thereby forming a second silicon oxide film from the poly-crystalline silicon film, forming a first insulating film including the first silicon oxide film and the second silicon oxide film; and (f) forming a first conductive film so as to embed the inside of the trench via the first insulating film, wherein the step of (f) includes steps of:

(f1) after the step of (e), in the inside of the trench, forming a second conductive film on the first insulating film;

(f2) after the step of (f1), reducing a thickness of the second conductive film by performing an anisotropic etching treatment to the second conductive film; and (f3) after the step of (f2), forming a third conductive film so as to embed the inside of the trench, and wherein the first conductive film includes the second conductive film and the third conductive film.

15. The method according to claim 14, wherein, in the step of (c), the first silicon oxide film is formed by a thermal oxidation treatment.

16. The method according to claim 15, further comprising a step of:

(o) after the step of (c) and before the step of (d), forming a third silicon oxide film on the first silicon oxide film by a CVD method, wherein, in the step of (d), the poly-crystalline silicon film is formed on the third silicon oxide film, wherein the first insulating film includes the first silicon oxide film, the second silicon oxide film and the third silicon oxide film, and wherein a thickness of the second silicon oxide film is greater than each of a thickness of the first silicon oxide film and a thickness of the third silicon oxide film.

17. The method according to claim 15, further comprising a step of:

(p) after the step of (e) and before the step of (f), forming a third silicon oxide film on the second silicon oxide film by a CVD method, wherein the first insulating film includes the first silicon oxide film, the second silicon oxide film and the third silicon oxide film, and wherein a thickness of the second silicon oxide film is greater than each of a thickness of the first silicon oxide film and a thickness of the third silicon oxide film.

* * * * *